(12) United States Patent
Shao et al.

(10) Patent No.: US 11,101,195 B2
(45) Date of Patent: Aug. 24, 2021

(54) PACKAGE STRUCTURE AND METHOD FOR FORMING THE SAME

(71) Applicant: Taiwan Semiconductor Manufacturing Co., Ltd., Hsinchu (TW)

(72) Inventors: Tung-Liang Shao, Hsinchu (TW); Wen-Lin Shih, Taipei (TW); Su-Chun Yang, Hsinchu County (TW); Chih-Hang Tung, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 19 days.

(21) Appl. No.: 16/373,915

(22) Filed: Apr. 3, 2019

(65) Prior Publication Data

US 2020/0091039 A1     Mar. 19, 2020

Related U.S. Application Data

(60) Provisional application No. 62/732,652, filed on Sep. 18, 2018.

(51) Int. Cl.
    *H01L 23/00*        (2006.01)
    *H01L 23/48*        (2006.01)
                   (Continued)

(52) U.S. Cl.
CPC ...... *H01L 23/481* (2013.01); *H01L 21/76873* (2013.01); *H01L 21/76898* (2013.01); *H01L 23/5226* (2013.01); *H01L 23/5283* (2013.01); *H01L 24/09* (2013.01); *H01L 24/17* (2013.01); *H01L 24/27* (2013.01); *H01L 24/33* (2013.01); *H01L 24/73* (2013.01); *H01L 25/50* (2013.01); *H01L 2224/0401* (2013.01); *H01L 2224/73253* (2013.01)

(58) Field of Classification Search
CPC ............. H01L 23/481; H01L 21/76873; H01L 21/76898; H01L 23/5226; H01L 23/5283; H01L 24/09; H01L 24/17; H01L 24/27; H01L 24/33; H01L 24/73; H01L 25/50
See application file for complete search history.

(56) References Cited

U.S. PATENT DOCUMENTS

2006/0121690 A1\* 6/2006 Pogge .................. H01L 23/481
                                                 438/455
2011/0042815 A1\* 2/2011 Ikeda .................... H01L 23/488
                                                 257/762
2019/0057974 A1\* 2/2019 Lu ..................... H01L 27/11565

\* cited by examiner

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

A package structure and method for forming the same are provided. The package structure includes a first interconnect structure formed over a first substrate, and the first interconnect structure includes a first metal layer. The package structure further includes a second interconnect structure formed over a second substrate. The package structure includes a bonding structure between the first interconnect structure and the second interconnect structure. The bonding structure includes a first intermetallic compound (IMC) and a second intermetallic compound (IMC), a portion of the first IMC protrudes from the sidewall surfaces of the second IMC, and there could be a grain boundary between the first IMC and the second IMC.

20 Claims, 23 Drawing Sheets

(51) Int. Cl.
*H01L 21/768* (2006.01)
*H01L 23/522* (2006.01)
*H01L 23/528* (2006.01)
*H01L 25/00* (2006.01)

PACKAGE STRUCTURE AND METHOD FOR FORMING THE SAME

CROSS REFERENCE TO RELATED APPLICATIONS

This Application claims the benefit of U.S. Provisional Application No. 62/732,652, filed on Sep. 18, 2018, and entitled "Package Structure and method for forming the same, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structures have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1I' shows a cross-sectional representation of the bonding structure between the first die and the second die, in accordance with some embodiments of the disclosure.

FIG. 2H' shows a cross-sectional representation of the bonding structure between the first die and the second die, in accordance with some embodiments of the disclosure.

DETAILED DESCRIPTION

Figure 1A:
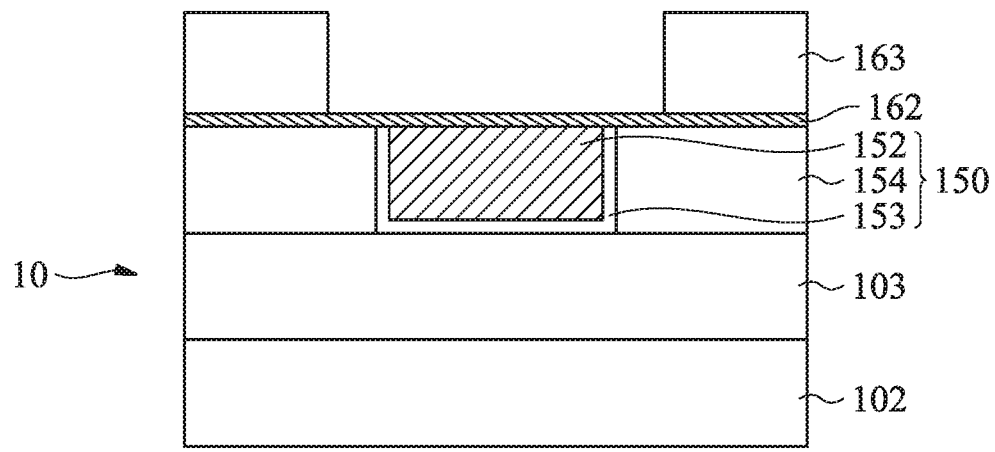
FIGS. 1A-1I show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIGS. 1A-1I show cross-sectional representations of various stages of forming a package structure 30, in accordance with some embodiments of the disclosure. The package structure 30 includes forming an intermetallic compound (IMC) first and the IMC is then bonded to the solder layer to form the bonding structure. Since the IMC is an oxide-free material, the package structure with the bonding structure is formed without flux (used for removing unwanted oxide).

As shown in FIG. 1A, a first die 10 is received. The first die 10 includes a first substrate 102. The first substrate 102 may be made of silicon or other semiconductor materials. Alternatively or additionally, the first substrate 102 may include other elementary semiconductor materials such as germanium. In some embodiments, the first substrate 102 is made of a compound semiconductor such as silicon carbide, gallium arsenic, indium arsenide, or indium phosphide. In some embodiments, the first substrate 102 is made of an alloy semiconductor such as silicon germanium, silicon germanium carbide, gallium arsenic phosphide, or gallium indium phosphide. In some embodiments, the first substrate 102 includes an epitaxial layer. For example, the first substrate 102 has an epitaxial layer overlying a bulk semi-conductor.

A first device region 103 is formed over the first substrate 102. The devices (not shown) are formed in the first device region 103 are formed over the first substrate 102 in a front-end-of-line (FEOL) process. The device may include various N-type metal-oxide semiconductor (NMOS) and/or P-type metal-oxide semiconductor (PMOS) devices, such as transistors or memories, and the like, which are interconnected to perform one or more functions. Other devices, such as capacitors, resistors, diodes, photo-diodes, fuses, and the like may also be formed on the first substrate 102.

A first interconnect structure 150 is formed over the first substrate 102. The first interconnect structure 150 includes a first metal layer 152 formed in a first dielectric layer 154. In addition, in some embodiments, the first metal layer 152 is surrounded by a first diffusion barrier layer 153.

The first metal layer 152 is made of copper (Cu), copper alloy, aluminum (Al), aluminum alloys, or a combination thereof. The first diffusion barrier layer 153 may be made of silicon nitride (SiN), silicon oxynitride (SiON), titanium nitride (TiN), tantalum nitride (TaN) or aluminum nitride (AlN). In some embodiments, the first metal layer 152 is made of copper (Cu), and the first diffusion barrier layer 153 is made of TaN/Ta bi-layer. In some embodiments, the first interconnect structure 150 is formed in a back-end-of-line (BEOL) process. In some embodiments, the first dielectric layer 154 is made of oxide, such as silicon oxide (SiOx). In some other embodiments, the first dielectric layer 154 is made of polymer, such as benzocyclobutene (BCB) polymer, polyimide (PI), or polybenzoxazole (PBO). The first metal layer 152, the first diffusion barrier layer 153 and the first dielectric layer 154 are independently formed by a deposition process, such as a chemical vapor deposition (CVD) process, a physical vapor deposition (PVD) process, or another applicable process.

Afterwards, a first seed layer 162 is formed over the first interconnect structure 150, and a photoresist (PR) layer 163 is formed over the first seed layer 162. The first seed layer 162 is made of a conductive material, such as titanium (Ti), copper (Cu), tin (Sn), aluminum (Al), nickel (Ni), silver (Ag), gold (Au), or alloy thereof. In some embodiments, the first seed layer 162 is formed by an electroplating process, or another applicable process.

The PR layer 163 is patterned by a patterning process to expose a portion of the first seed layer 162. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Figure 1B:
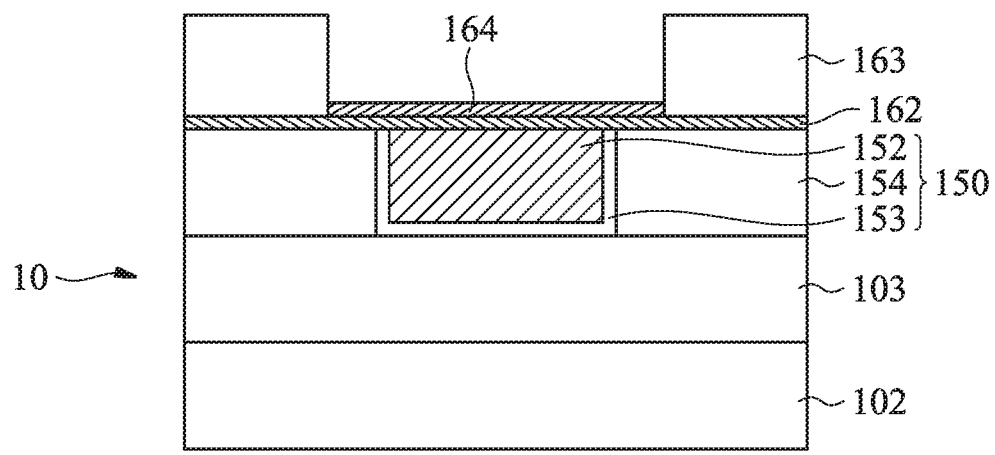

Next, as shown in FIG. 1B, a first barrier layer 164 is formed over the first seed layer 162, in accordance with some embodiments of the disclosure. The first barrier layer 164 is used as a barrier to prevent the first solder layer 166 (shown in FIG. 1E) from diffusing downward.

In some embodiments, the first barrier layer 164 is made of a metal layer, such as copper (Cu), copper alloy, nickel (Ni), nickel alloy, aluminum (Al), aluminum alloy, tin (Sn), tin alloy, lead (Pb), lead alloy, silver (Ag), silver alloy or a combination thereof. In some embodiments, the first seed layer 162 is made of Ti/Cu, and the first barrier layer 164 is made of nickel (Ni). In some other embodiments, the first barrier layer 164 is made of nickel/copper (Ni/Cu). When the first barrier layer 164 is made of nickel/copper (Ni/Cu), the nickel layer is firstly deposited before the copper layer since the nickel is used as barrier.

Figure 1C:
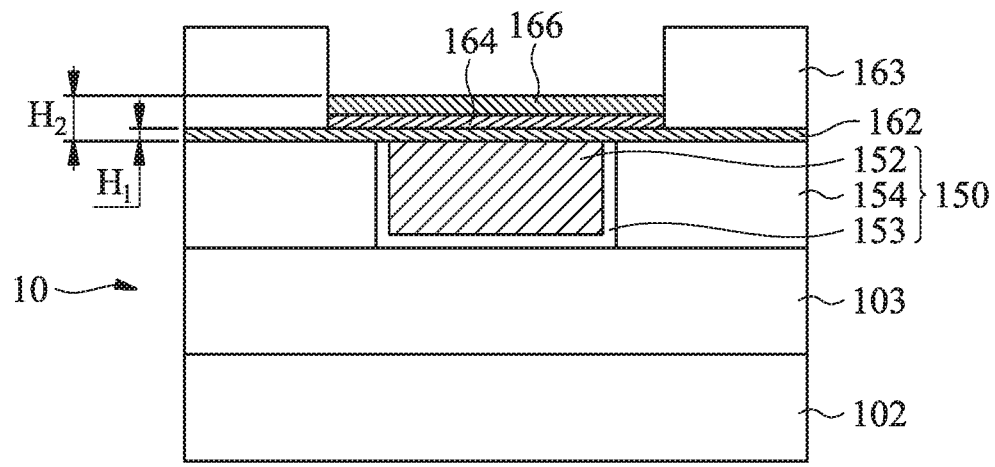

Afterwards, as shown in FIG. 1C, a first solder layer 166 is formed over the first barrier layer 164, in accordance with some embodiments of the disclosure. In some embodiments, the first solder layer 166 is made of tin (Sn), SnAg, SnPb, SnAgCu, SnAgZn, SnZn, SnBiIn, SnIn, SnAu, SnPb, SnCu, SnZnIn, SnAgSb or another applicable material.

The first barrier layer 164 has a first height $H_1$ along a vertical direction. The first solder layer 166 has a second height $H_2$ along a vertical direction. In some embodiments, a ratio ($H_1/H_2$) of the first height $H_1$ of the first barrier layer 164 to the second height $H_2$ of the first solder layer 166 is in a range from about 0.3 to about 0.5.

It should be noted that the first barrier layer 164 should be remaining and the first solder layer 166 should be consumed completely since the first barrier layer 164 is used as a barrier to prevent the first solder layer 166 diffusing into the first conductive layer 152. Therefore, the ratio of the first height $H_1$ to the second height $H_2$ is within above-mentioned range to prevent the unwanted chemical reaction.

Figure 1D:
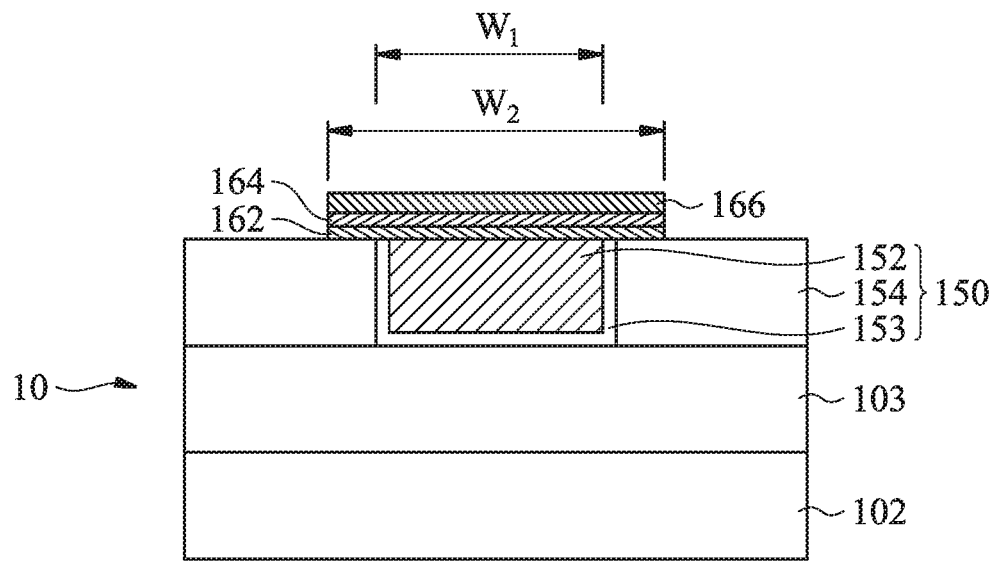

Subsequently, as shown in FIG. 1D, the PR layer 163 is removed, and a portion of the seed layer 162 underlying the PR later 163 is removed, in accordance with some embodiments of the disclosure. In some embodiments, the PR layer 163 and the portion of the seed layer 162 are removed by an etching process, such as a wet etching process or a dry etching process.

The first metal layer 152 has a first width $W_1$ along a horizontal direction, and the first barrier layer 164 has a second width $W_2$ along a horizontal direction. In some embodiments, the second width $W_2$ of the first barrier layer 164 is greater than the first width $W_1$ of the first metal layer 152. It should be noted that the first barrier layer 164 is wider than the first metal layer 152 to effectively prevent the underlying first metal layer 152 (such as copper) from diffusing during the following reflow process.

Figure 1E:
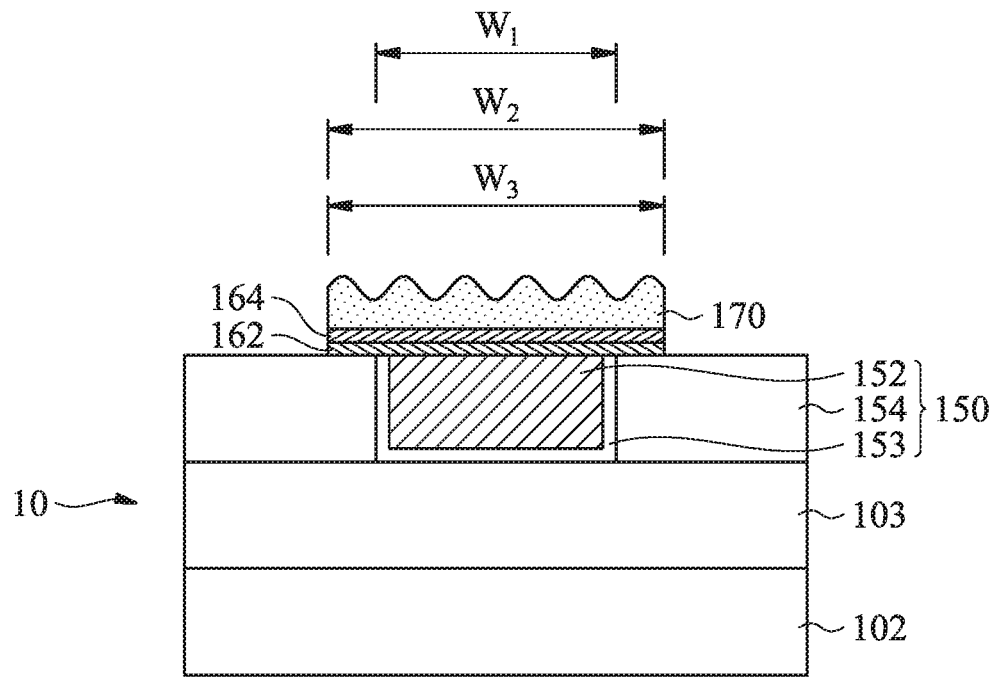

Afterwards, as shown in FIG. 1E, performing a first reflow process on the first solder layer 166 and the first barrier layer 164 to form a first IMC 170, in accordance with some embodiments of the disclosure. The first IMC 170 has a number of protruding structures. In some embodiments, the first IMC 170 has a number of needle-shaped structures. The top surface of the first IMC 170 is uneven.

The first IMC 170 includes materials from the first solder layer 166 and the other metal. In some embodiments, the material (such as Sn) of the first solder layer 166 and the material (such as Ni) of the first barrier layer 164 migrate and react with each other to form the first IMC 170. In some other embodiments, the material (such as Sn) of the first solder layer 166, and the material (such as Ni/Cu) of the first barrier layer 164 migrate and react with each other to form the first IMC 170.

The first IMC 170 may be referred to as an intermetallic alloy, an ordered intermetallic alloy, or a long-range-ordered alloy. The first IMC 170 is a solid-state compound containing two or more metallic elements, and exhibits metallic bonding and ordered crystal structure. In some embodiments, the first IMC 170 includes $Ni_3Sn_4$, $Cu_6Sn_5$, $(CuNi)_6Sn_5$, $(CuNi)_3Sn_4$, $Cu_{11}(InSn)_9$, $Ni_3In_7$, $Ni_3(InSn)_7$ or another applicable material.

The first reflow process is used to melt the material of the first solder layer 166, and therefore the first reflow process is operated at a temperature which is higher than the melting point of the first solder layer 166. In some embodiments, the first reflow process is operated at a temperature in a range from about 200 degrees Celsius to about 270 degrees Celsius. In some embodiments, the first reflow process is operated for a period of time in a range from about 400 s to about 800 s.

The first IMC 170 has a third width $W_3$ along a horizontal direction. In some embodiments, the third width $W_3$ of the first IMC 170 is substantially equal to the second width $W_2$ of the first barrier layer 164. In some embodiments, the third width $W_3$ of the first IMC 170 is greater than the first width $W_1$ of the first metal layer 152.

Figure 1F:
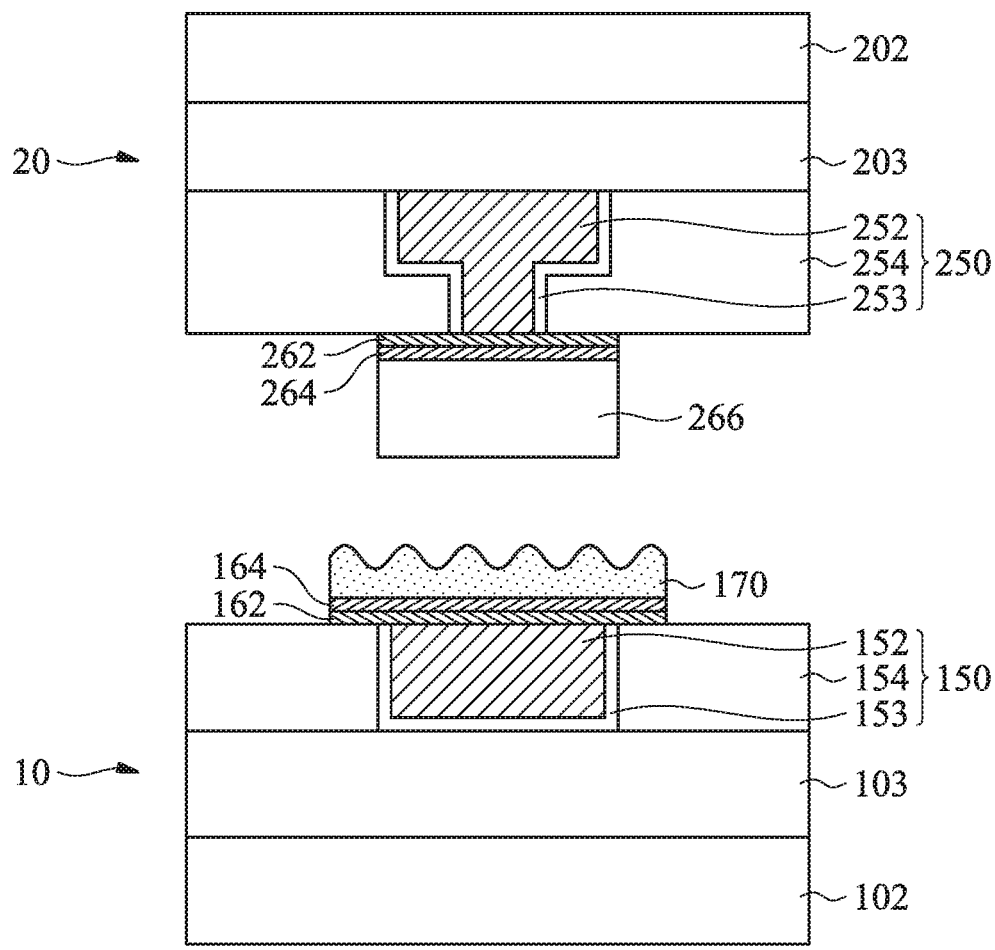

Next, as shown in FIG. 1F, a second die 20 is provided, in accordance with some embodiments of the disclosure. A second device region 203 is formed over the second substrate 202. The second die 20 includes a second interconnect structure 250 formed over a second substrate 202. The second interconnect structure 250 includes a second metal layer 252 formed in the dielectric layer 254. In addition, in some embodiments, the second metal layer 252 is surrounded by a second diffusion barrier layer 253.

The second metal layer 252 is made of copper (Cu), copper alloy, aluminum (Al), aluminum alloys, or a combination thereof. The diffusion barrier layer 253 may be made of silicon nitride (SiN), silicon oxynitride (SiON), titanium nitride (TiN), tantalum nitride (TaN) or aluminum nitride (AlN). In some embodiments, the second metal layer 252 is made of copper (Cu), and the second diffusion barrier layer 253 is made of TaN/Ta bi-layer. In some embodiments, the second interconnect structure 250 is formed in a back-end-of-line (BEOL) process. In some embodiments, the dielectric layer 254 is made of oxide, such as silicon oxide (SiOx) or polymer, such as benzocyclobutene (BCB) polymer, polyimide (PI), or polybenzoxazole (PBO). The second metal layer 252, the second diffusion barrier layer 253 and the dielectric layer 254 are independently formed by a deposition process, such as a chemical vapor deposition (CVD) process, a physical vapor deposition (PVD) process, or another applicable process.

Afterwards, a second seed layer 262 is formed over the second interconnect structure 250. Next, a second barrier layer 264 is formed over the second seed layer 262, and a second solder layer 266 is formed over the second barrier layer 264. The second seed layer 262 is similar to the first seed layer 162. The second barrier layer 264 is similar to the first barrier layer 164, and the second solder layer 266 is similar to the first solder layer 166.

In some other embodiments, a cleaning process is performed on the first IMC 170. The cleaning process is used to remove unwanted pollution on the top surface of the first IMC 170. In some embodiments, the cleaning process is used to remove unreacted solder material on the first IMC 170. In some embodiments, the cleaning process includes acid solution, such as hydrochloric solution (HCl). In some embodiments, the concentration of the hydrochloric solution (HCl) is in a range from about 20 wt % to about 40 wt %. In some embodiments, the cleaning process is operated for a period of time in a range from about 1 minute to about 10 minutes.

Figure 1G:
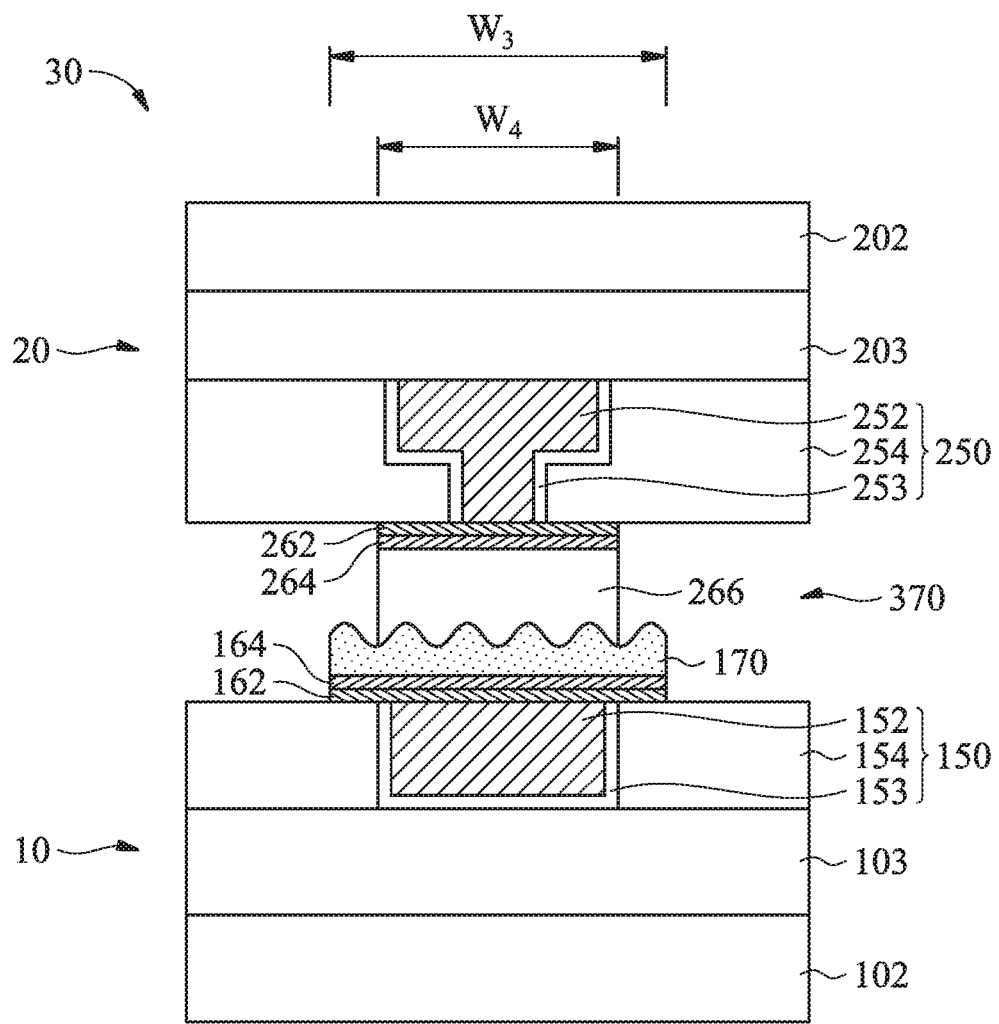

Next, as shown in FIG. 1G, the first substrate 102 (or the first die 10) is bonded to the second substrate 202 (or the second die 20) by bonding the first IMC 170 to the second solder layer 266, in accordance with some embodiments of the disclosure. As a result, a bonding structure 370 is between the first interconnect structure 150 and the second interconnect structure 250. The first die 10 is bonded to the second die 20 by performing a second reflow process.

The second solder layer 266 has a fourth width $W_4$ along a horizontal direction. In some embodiments, the fourth width $W_4$ of the second solder layer 266 is smaller than the third width $W_3$ of the first IMC 170.

Figure 1H:
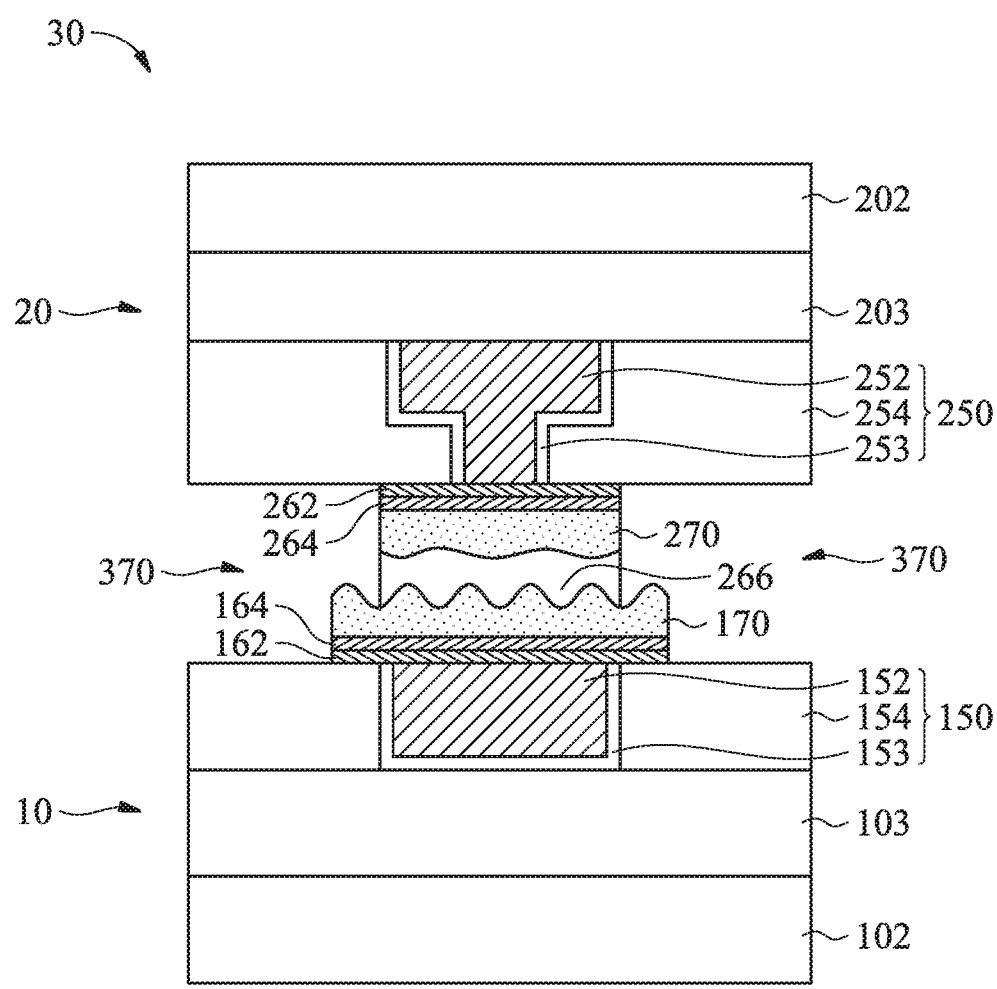

Next, as shown in FIG. 1H, the second IMC 270 is formed during the second reflow process, in accordance with some embodiments of the disclosure. The second IMC 270 includes materials from the second solder layer 266 and the second barrier layer 264. In some embodiments, the second IMC 270 is made of $Ni_3Sn_4$, $Cu_6Sn_5$, $(CuNi)_6Sn_5$, $(CuNi)_3Sn_4$, $Cu_{11}(InSn)_9$, $Ni_3In_7$, $Ni_3(InSn)_7$, or another applicable material. During the reflow process, the un-reacted second solder layer 266 is remaining between the first IMC 170 and the second IMC 270. In some embodiments, the second reflow process is operated at a temperature in a range from about 200 degrees Celsius to about 270 degrees Celsius. In some embodiments, the second reflow process is operated for a period of time in a range from about 60 s to about 120 s.

Figure 1I:
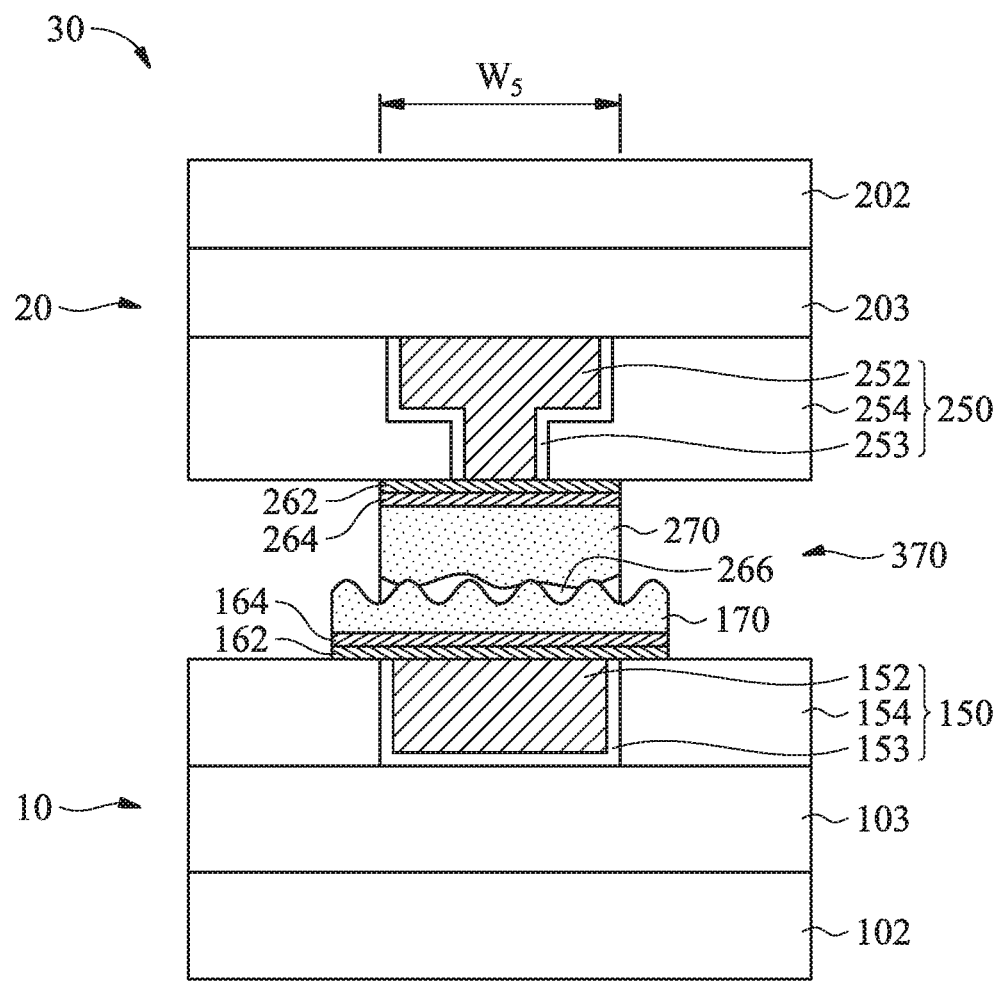
Figure 1I:
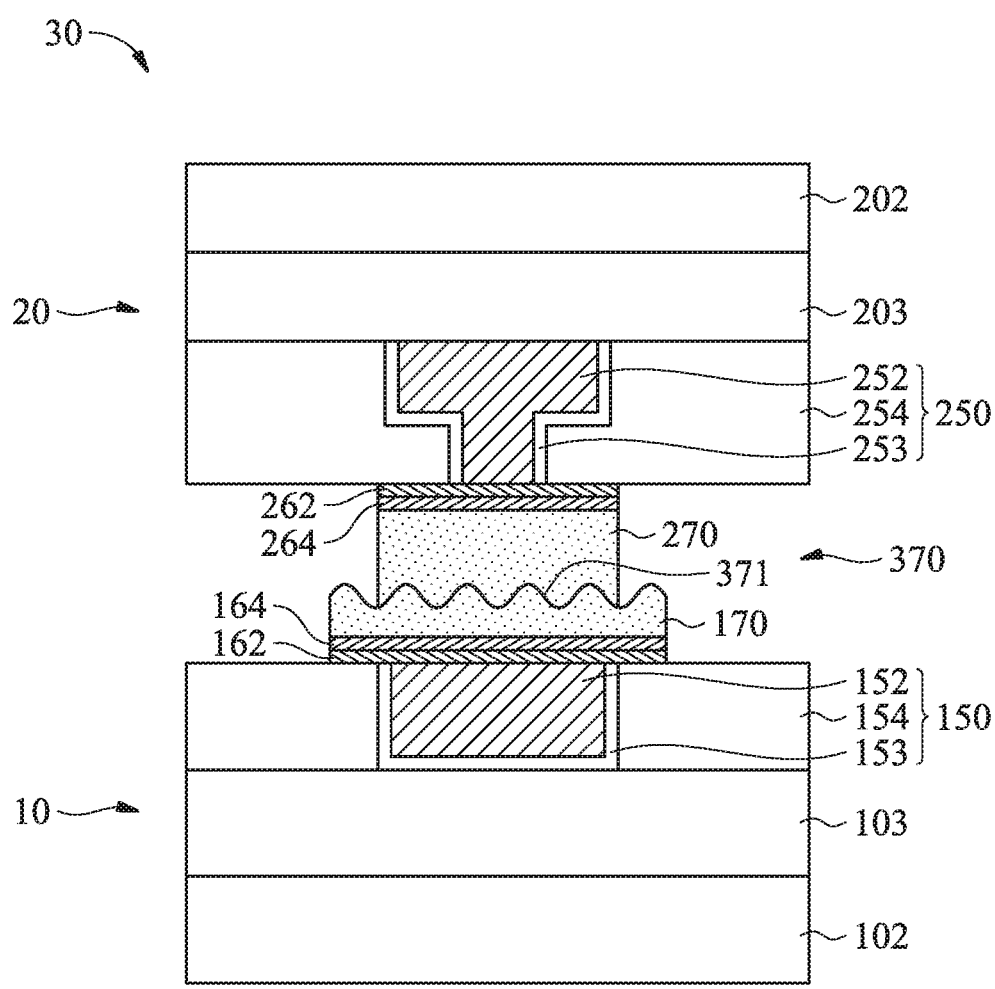

Next, as shown in FIG. 1I, the amount of the second IMC 270 is gradually increased as the operation time of the reflow process is gradually increased, in accordance with some embodiments of the disclosure. In some embodiments, the second solder layer 266 is not reacted completely, and therefore the un-reacted second solder layer 266 is remaining in the bonding structure 370. The remaining second solder layer 266 may have irregular shape between the first IMC 170 and the second IMC 270. A portion of the bottom surface of the second IMC 270 is in direct contact with a portion of the top surface of the first IMC 170. The shape of first IMC 170 is not symmetric to the shape of the second IMC 270.

In some embodiments, the first IMC 170 and the second IMC 270 are made of the same materials, such as $Ni_3Sn_4$. In some other embodiments, the first IMC 170 and the second IMC 270 are made of different materials. For example, the first IMC 170 is made of $Ni_3Sn_4$, and the second IMC 270 is made of $(CuNi)_6Sn_5$.

The first IMC 170 is formed firstly, and then the second IMC 270 is gradually expanded toward to the first IMC 170 during the reflow process. Since the first IMC 170 and the second IMC 270 is not formed simultaneously. The grain boundary may be irregular. The first IMC 170 and the second IMC 270 have different grain sizes. In some embodiments, partial grain impingement occurred between the first IMC 170 and the second IMC 270 yet there is still a distinct grain boundary between the first IMC 170 and the second IMC 270. The grain boundary between the first IMC 170 and the second IMC 270 can be observed using a polarized optical microscope (OM) or a scanning electron microscope (SEM). The grain boundary is the interface between the first grain of the first IMC 170 and the second grain of the second IMC 270.

It should be noted that the first IMC 170 has a stable structure before the reflow process, and therefore the first IMC 170 does not obviously move or change its shape after the reflow process. The grain size of the first IMC 170 before the reflow process is substantially equal to the grain size of the first IMC 170 after the reflow process.

As mentioned above, the fourth width $W_4$ of the second solder layer 266 is smaller than the third width $W_3$ of the first IMC 170. When the second IMC 270 is formed, the fifth width $W_5$ of the second IMC 270 is still smaller than the third width $W_3$ of the first IMC 170. Therefore, a portion of the first IMC 170 protrudes from the sidewall surface of the second IMC 270.

It should be noted that the first IMC 170 is not easily oxidized compared to other metal materials (such as copper), and therefore the first IMC 170 provides a fresh and clean bonding top surface. In some embodiments, the first IMC 170 is not oxidized at the operation temperature (such as 200 degrees Celsius to about 270 degrees Celsius) during the reflow process. The second solder layer 266 is directly bonded to the top surface the first IMC 170 without using flux since no oxide is formed on the first IMC 170.

Furthermore, the first IMC 170 has a number of protruding structures in direct contact with the second solder layer 266. The second solder layer 266 is relatively soft compared to the first IMC 170. Therefore, the oxide formed over the surfaces of the second solder layer 266 may be broken by the protruding structures of the first IMC 170 when the first IMC 170 is in direct contact with the second solder layer 266. The fresh surfaces of the second solder layer 266 are produced to be in direct contact with the first IMC 170. Therefore, the contact force between the first IMC 170 and the second solder layer 266 is reduced.

As the pitch between two adjacent bonding structures 370 is gradually decreased, the present fluxless bonding process can prevent unwanted issues. The use of flux has several drawbacks in semiconductor contact technology. The material of the flux is generally corrosive. The flux may be difficult to remove and any remnants that remain may produce short circuiting problems. Therefore, the embodiments provide a fluxless method for forming the package structure 30 and the bonding quality and bonding yield are improved.

It should be noted that the bonding of the second solder layer 266 and the first IMC 170 are operated at relatively lower temperature compared with the copper-to-copper bonding. Therefore, the bonding process has a low thermal budget (the thermal budget is defined as a limit on how much the workpiece can be heated without damage).

FIG. 1I' shows a cross-sectional representation of the bonding structure 370 between the first die 10 and the second die 20, in accordance with some embodiments of the disclosure. The bonding structure 370 includes the first IMC 170 and the second IMC 270. The outer sidewall surface of the first IMC 170 is not aligned with the outer sidewall surface of the second IMC 270. The outer sidewall surface of the first IMC 170 exceeds the outer sidewall surface of the second IMC 270. A portion of the first IMC 170 protrudes from the sidewall surfaces of the second IMC 270.

In some embodiments, the second solder layer 266 is completely consumed, and therefore the entirety of the bottom surface of the second IMC 270 is substantially contact with the top surface of the first IMC 170. A grain boundary 371 is between the first IMC 170 and the second IMC 270. The first IMC 170 and the second IMC 270 have different grain sizes.

FIGS. 2A-2H show cross-sectional representations of various stages of forming a package structure 30, in accordance with some embodiments of the disclosure.

Figure 2A:
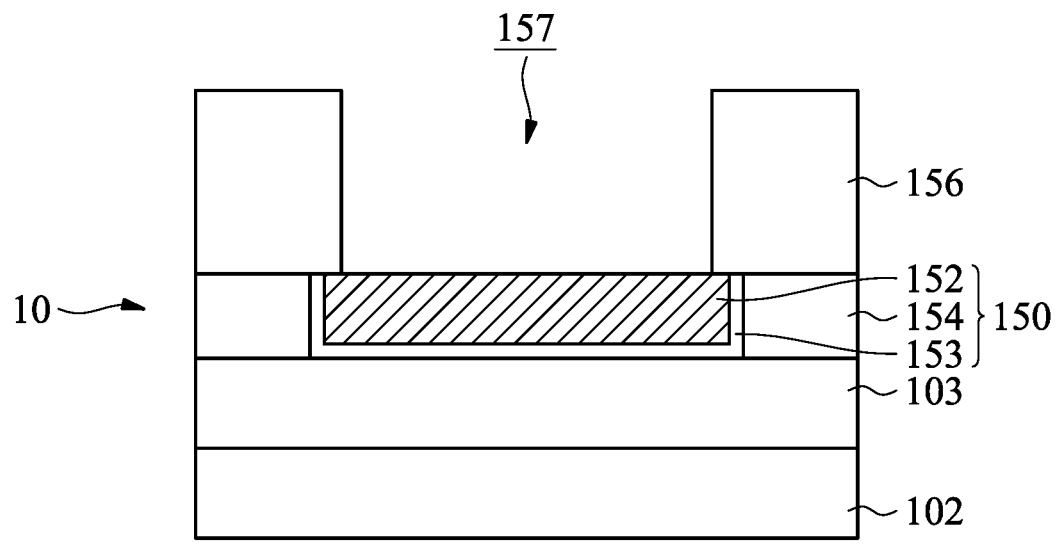
FIGS. 2A-2H show cross-sectional representations of various stages of forming a package structure, in accordance with some embodiments of the disclosure.

As shown in FIG. 2A, a first device region 103 is formed over the first substrate 102, and the first interconnect structure 150 is formed over the first substrate 102. The first interconnect structure 150 includes a first dielectric layer 154, a second dielectric layer 156 and a first metal layer 152. The second dielectric layer 156 is patterned to have a recess 157 to expose the top surface of the first metal layer 152.

Figure 2B:
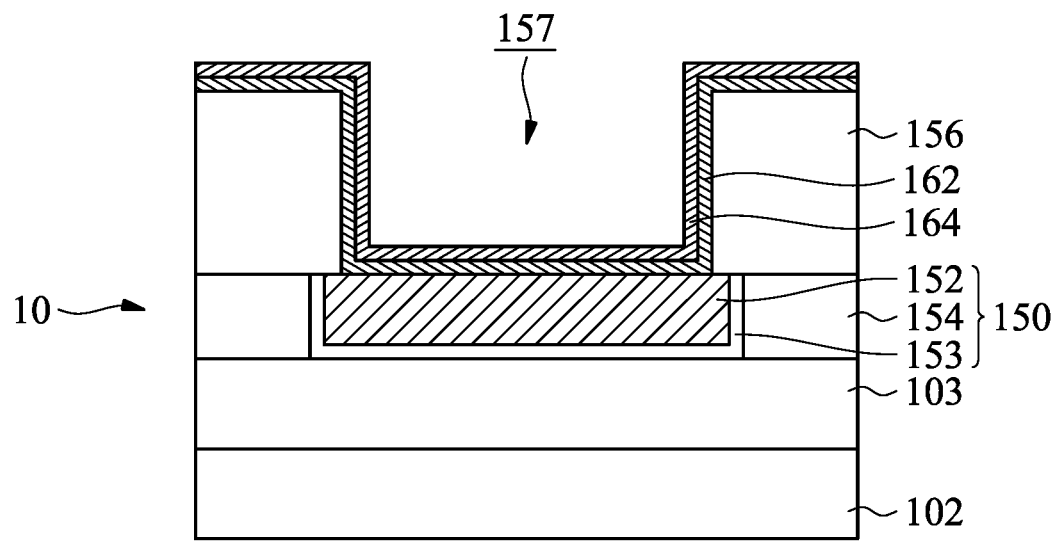

Next, as shown in FIG. 2B, the first seed layer 162 and the first barrier layer 164 are sequentially formed in the recess 157, in accordance with some embodiments of the disclosure. The first seed layer 162 and the first barrier layer 164 are conformally formed on the second dielectric layer 156 and the top surface of the first metal layer 152. In some other embodiments, the first seed layer 162 is made of Ti/Cu, and the first barrier layer 164 is made of Ni. In some other embodiments, the first seed layer 162 is made of Ti/Cu, and the first barrier layer 164 is made of Ni/Cu. In some embodiments, the titanium layer, the first copper layer, the nickel layer and the second copper layer are sequentially formed over the first metal layer 152.

Figure 2C:
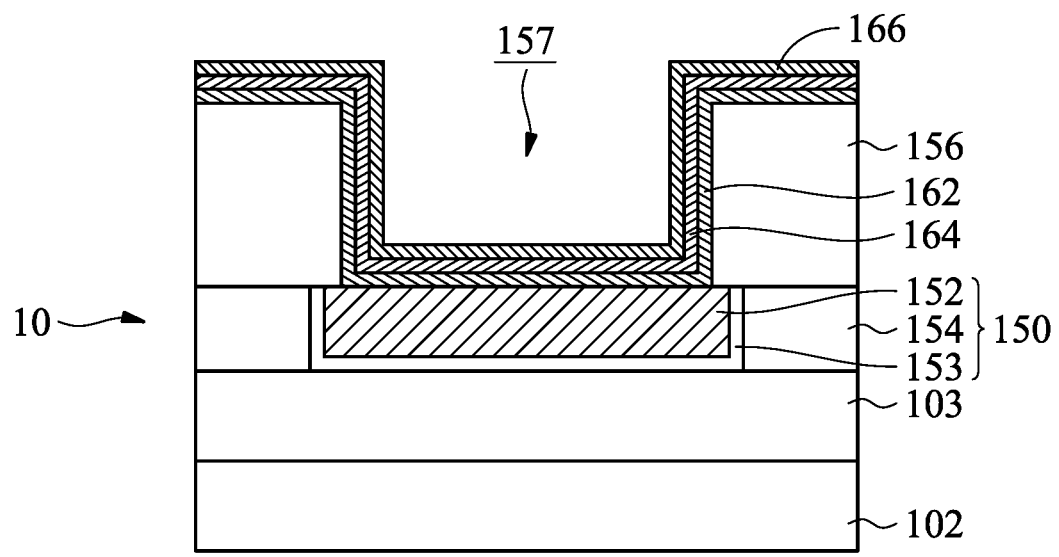

Next, as shown in FIG. 2C, the first solder layer 166 is formed over the first barrier layer 164, in accordance with some embodiments of the disclosure. The first solder layer 166 may be made of tin (Sn), SnAg, SnPb, SnAgCu, SnAgZn, SnZn, SnBiIn, SnIn, SnAu, SnPb, SnCu, SnZnIn, SnAgSb or another applicable material.

Figure 2D:
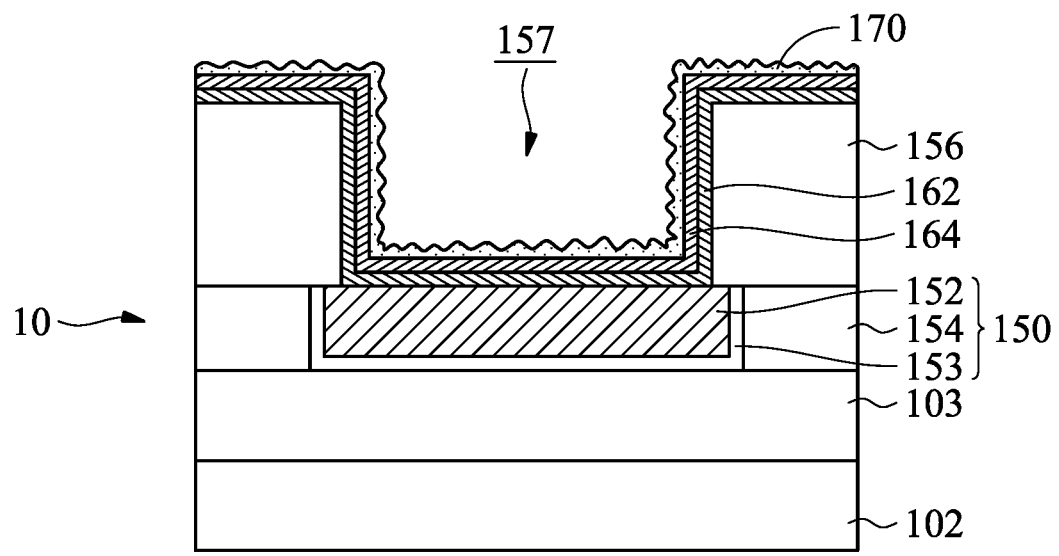

Afterwards, as shown in FIG. 2D, performing a reflow process on the first solder layer 166 and the first barrier layer 164 to form the first IMC 170, in accordance with some embodiments of the disclosure. The first IMC 170 has a number of protruding structures. The top surface of the first IMC 170 is uneven. In some embodiments, IMC 170 and first barrier layer 164 and first seed layer 162 on second dielectric 156 could be polished by a planarization process, such as by chemical mechanical polishing approach (CMP).

The first IMC 170 includes materials from the first solder layer 166 and the first barrier layer 164. In some embodiments, the first IMC 170 includes $Ni_3Sn_4$, $Cu_6Sn_5$, $(CuNi)_6Sn_5$, $(CuNi)_3Sn_4$, $Cu_{11}(InSn)_9$, $Ni_3In_7$, $Ni_3(InSn)_7$, or another applicable material.

Figure 2E:
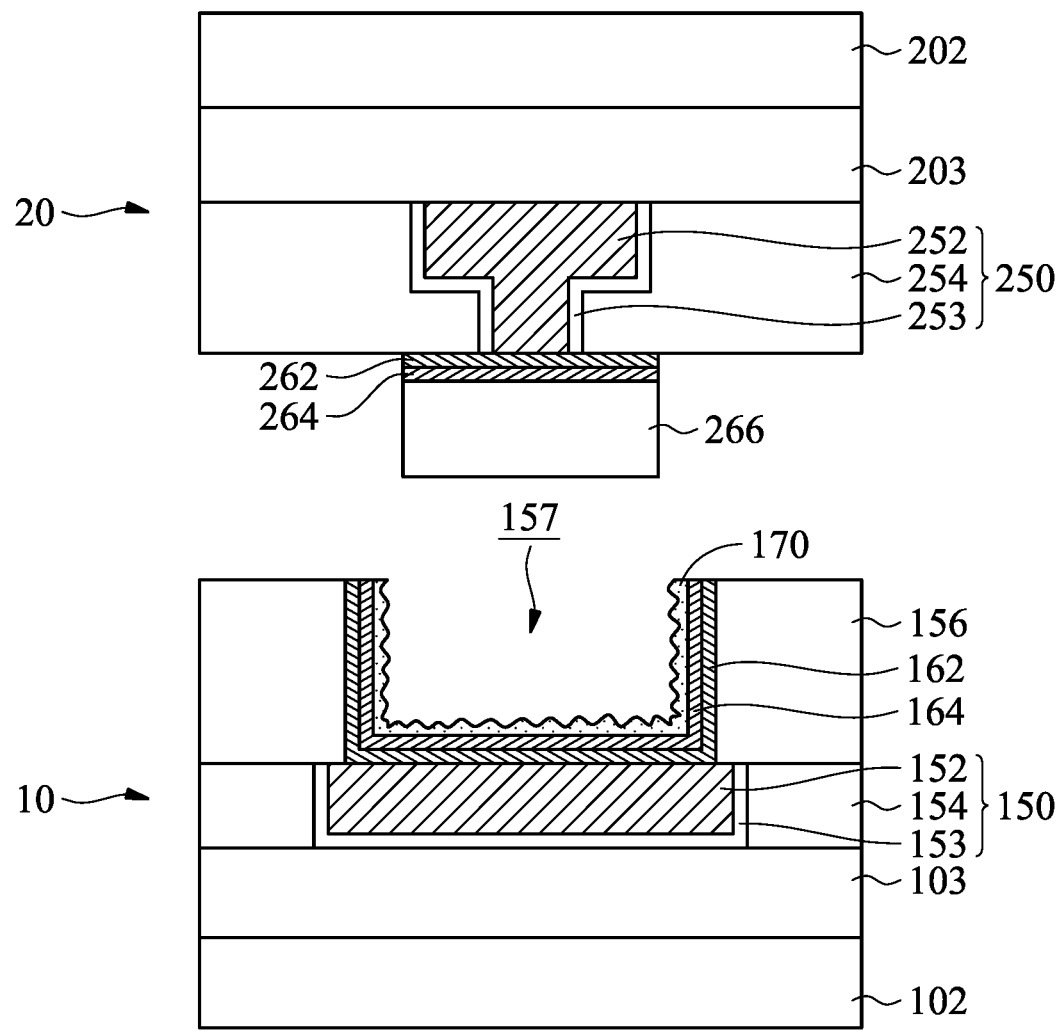

Afterwards, as shown in FIG. 2E, the second die 20 is provided, in accordance with some embodiments of the disclosure. The second die 20 includes the second substrate 202. The second device region 203 is formed over the second substrate 202, and the second interconnect structure 250 over the second substrate 202. The second seed layer 262 is formed over the dielectric layer 254, the second barrier layer 264 and the second solder layer 266 are sequentially formed over the second seed layer 262. The second solder layer 266 is aligned to the recess 157.

Figure 2F:
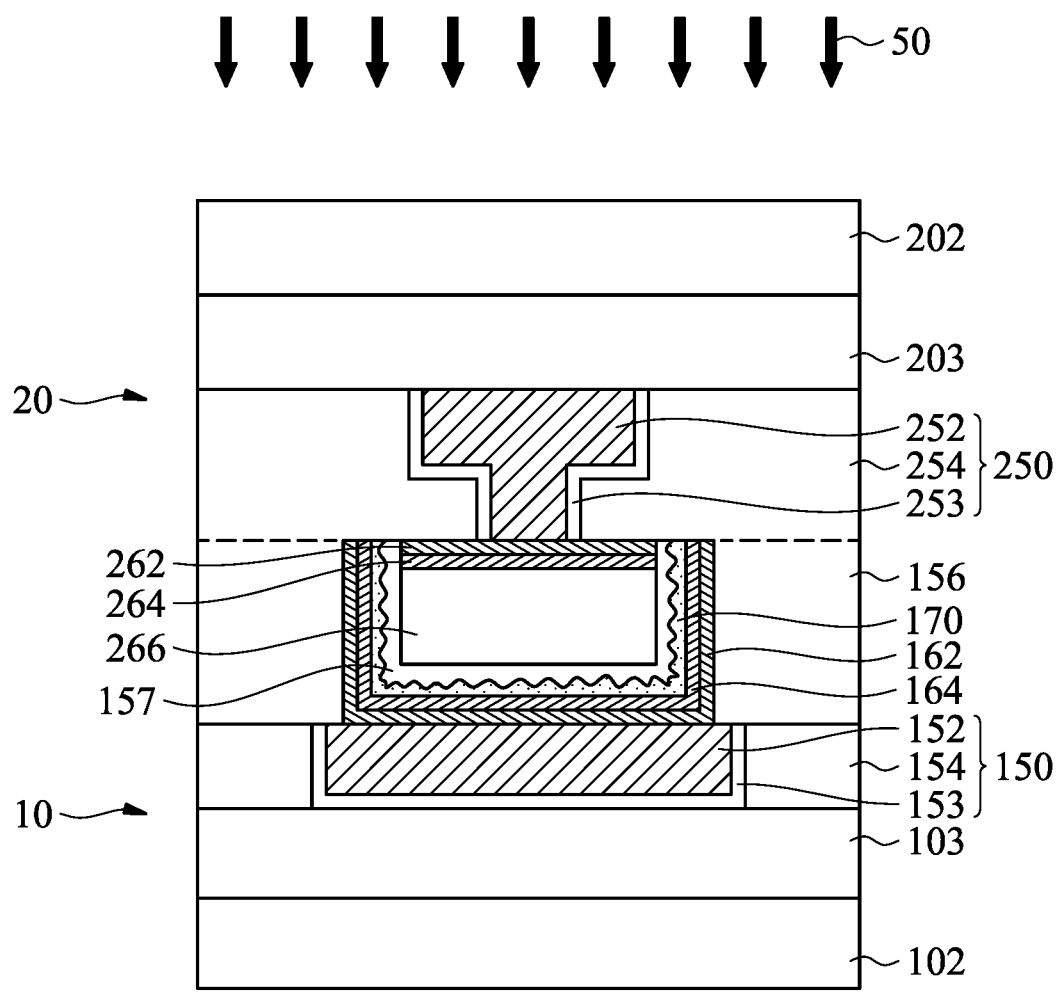

Next, as shown in FIG. 2F, the first die 10 is bonded to the second die 20 by bonding the second dielectric layer 156 to the dielectric layer 254, in accordance with some embodiments of the disclosure. The second dielectric layer 156 is bonded to the dielectric layer 254 to form a dielectric-to-dielectric bonding portion.

In some embodiments, bonding of the second dielectric layer 156 to the dielectric layer 254 is by performing a first reflow process 50. In some embodiments, bonding of the second dielectric layer 156 to the dielectric layer 154 is operated without applied additional pressure. The first reflow process 50 may include a first heating step and a second heating step. In some embodiments, the first heating step is operated at a temperature in a range from about 150 degrees Celsius to about 200 degrees Celsius. In some embodiments, the first heating step is operated for a period of time in a range from about 30 minutes to about 60 minutes. In some embodiments, the second heating step is a rapid thermal anneal (RTA) step, and the second heating step is operated at a temperature in a range from about 230 degrees Celsius to about 300 degrees Celsius. In some embodiments, the second heating step is operated for a period of time in a range from about 1 minute to about 10 minutes. The operation time of the second heating step is shorter than the operation time of the first heating step since the operation temperature of the second heating step is higher than the operation temperature of the first heating step.

Figure 2G:
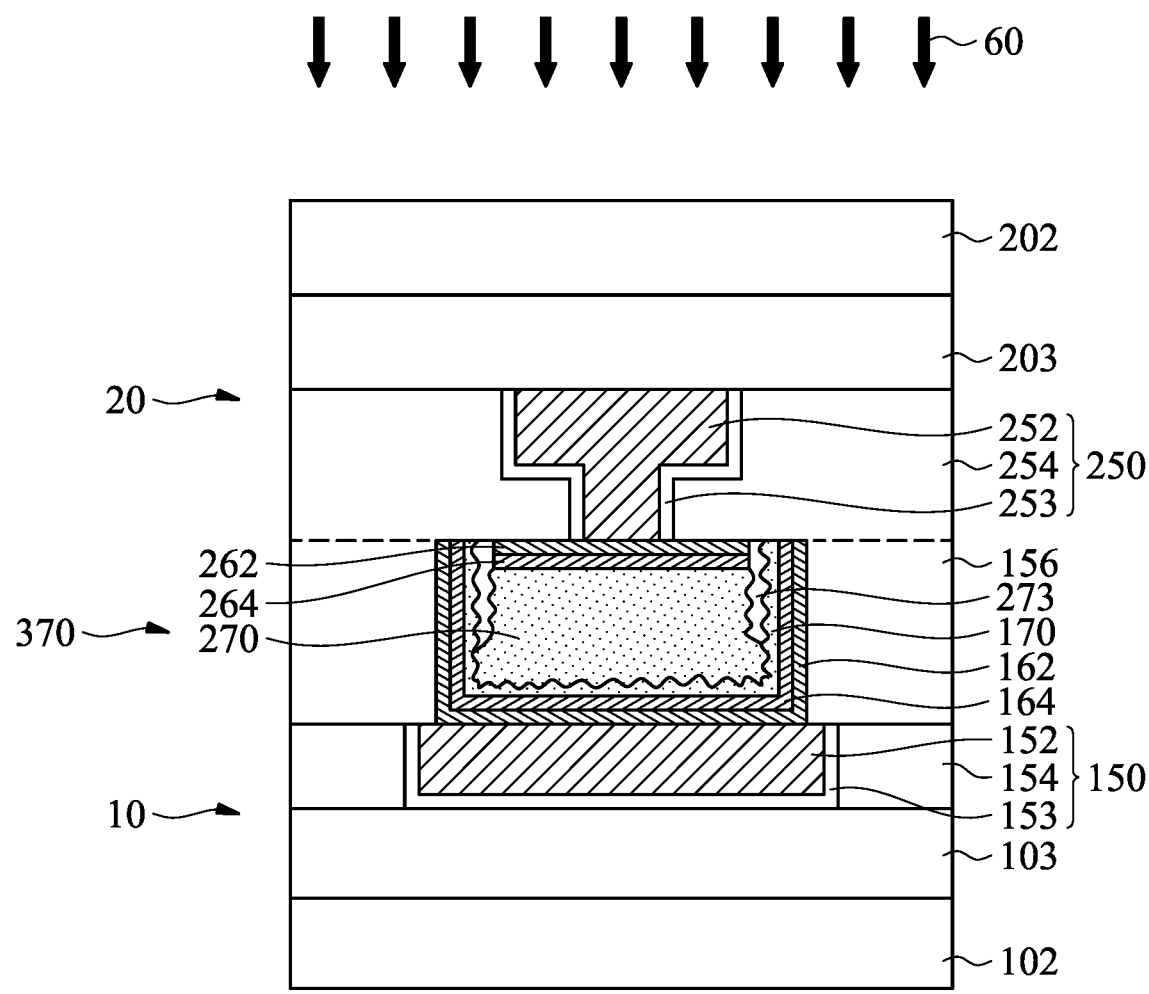

Next, as shown in FIG. 2G, the second IMC 270 is formed by performing a second reflow process 60 on the second solder layer 266 and the second barrier layer 264, in accordance with some embodiments of the disclosure. During the second reflow process, the second solder layer 266 is gradually reduced and the second IMC 270 is gradually expanded toward to the first IMC 170. A portion of the second solder layer 266 is not completely reacted with the second barrier layer 264, and the portion of the second solder layer 266 is remaining between the first IMC 170 and the second IMC 270. In addition, an air gap 273 is between the first IMC 170 and the second IMC 270.

In some embodiments, the second reflow process 60 is operated at a temperature in a range from about 150 degrees Celsius to about 270 degrees Celsius. In some embodiments, the second reflow process 60 is operated for a period of time in a range from about 400 s to about 800 s.

As shown in FIG. 2G, the bonding structure 370 is a hybrid bonding structure which includes a conductive bonding portion and a dielectric bonding portion. The conductive bonding portion includes the second IMC 270 and the first IMC 170, and the dielectric bonding portion includes the second dielectric layer 156 and the dielectric layer 254.

It should be noted that the bonding of the second dielectric layer 156 and the dielectric layer 154, and bonding of the second solder layer 266 and the first IMC 170 are operated at relatively lower temperature compared with the copper-to-copper bonding. Therefore, the bonding process has a low thermal budget.

Figure 2H:
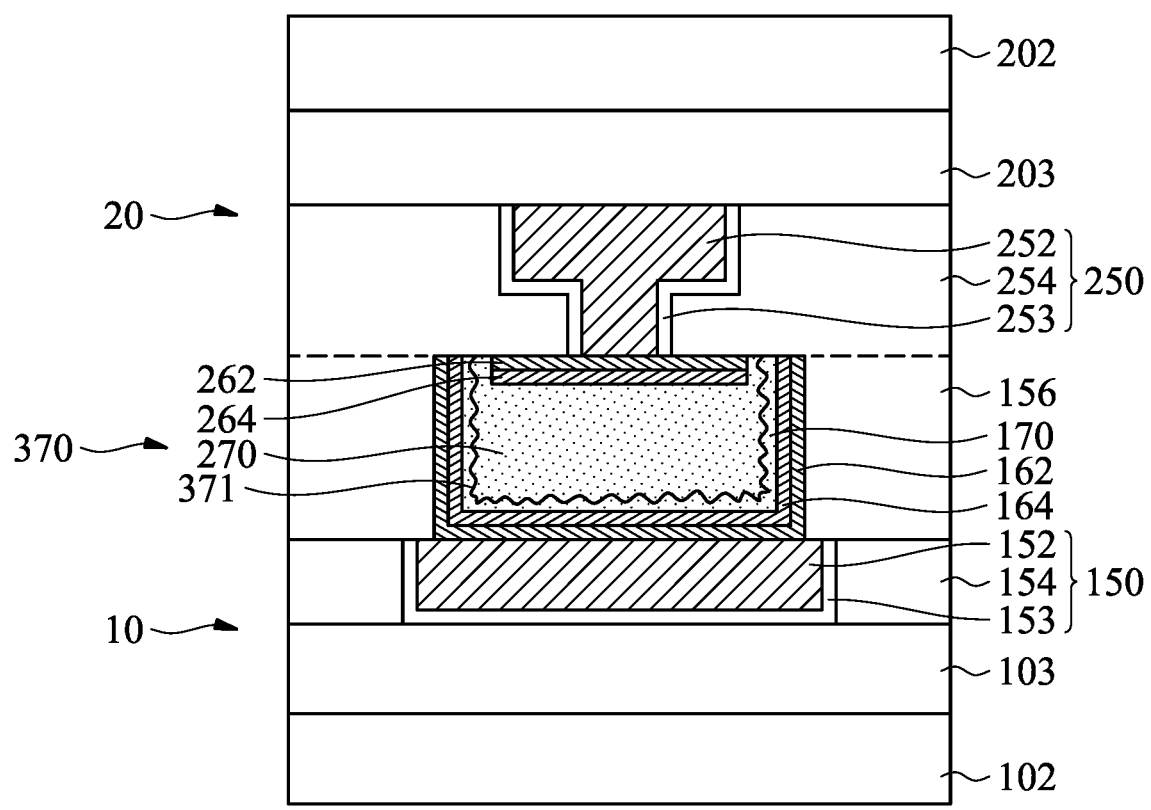
Figure 2H:
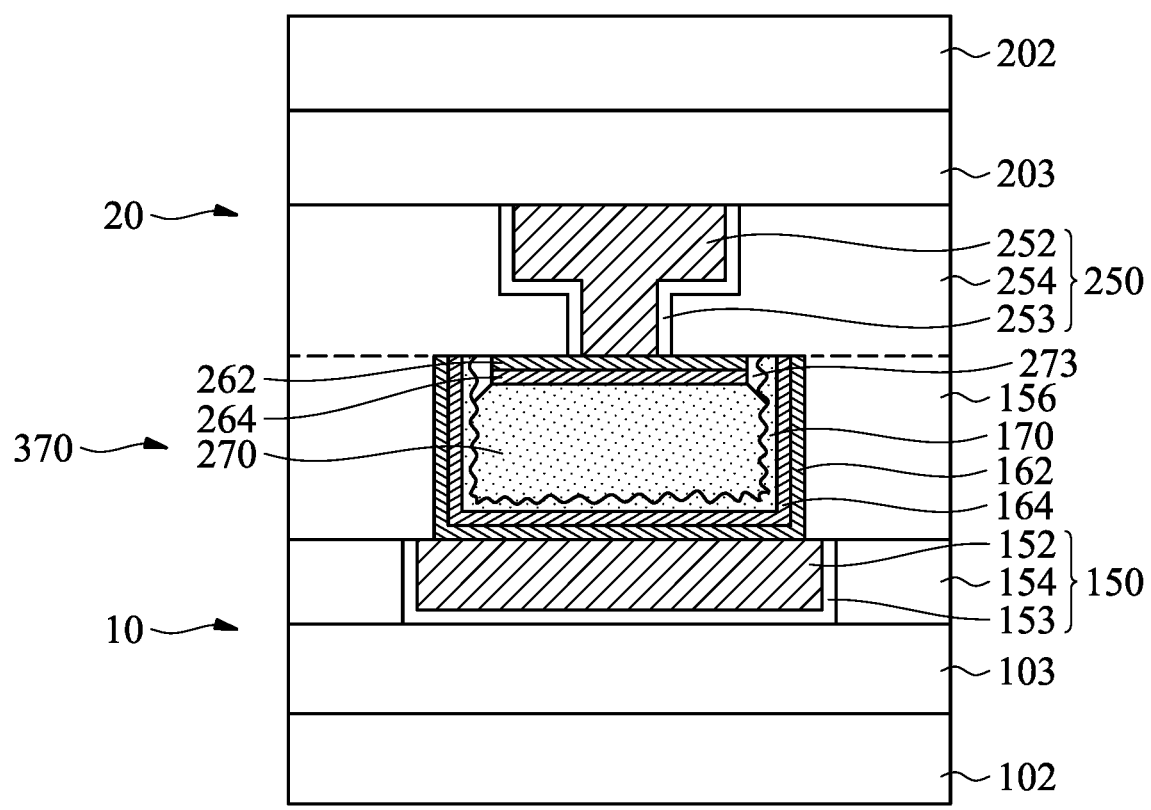

Next, as shown in FIG. 2H, the recess 157 is filled with the bonding structure 370, in accordance with some embodiments of the disclosure. The second solder layer 266 is completed consumed, and therefore no solder material is in the bonding structure 370. The grain boundary 371 between the first IMC 170 and the second IMC 270 is irregular. The entirety of the bottom surface and the sidewall surfaces of the second IMC 270 are in direct contact with the first IMC 170.

FIG. 2H' shows a cross-sectional representation of the bonding structure 370 between the first die 10 and the second die 20, in accordance with some embodiments of the disclosure. The bonding structure 370 mainly includes the first IMC 170 and the second IMC 270. The air gap 273 is between the bonding structure 370 and the second dielectric layer 156.

FIGS. 3A-3E show cross-sectional representations of various stages of forming a package structure 40, in accordance with some embodiments of the disclosure.

Figure 3A:
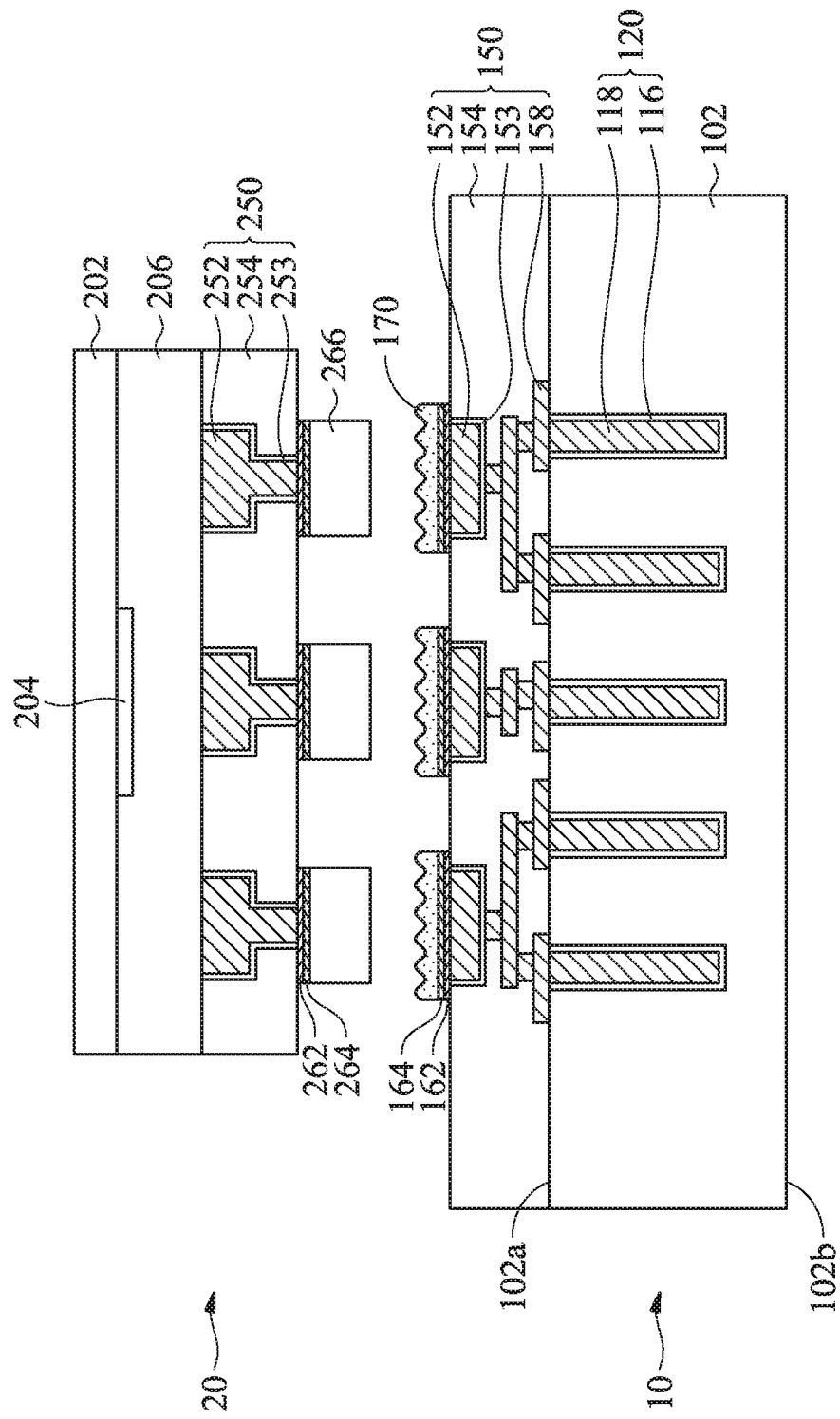
FIGS. 3A-3E show cross-sectional representations of various stages of forming a package structure, in accordance with some embodiments of the disclosure

As shown in FIG. 3A, a first die 10 and a second die 20 are provided. A number of through-substrate-via (TSV) structures 120 are formed in the first substrate 102. Each of the TSV structures 120 includes a conductive structure 116 and a barrier layer 118 surrounding the conductive structure 116. The conductive structure 116 extends from the first surface 102a of the first substrate 102 towards to the second surface 102b of the first substrate 102. The first interconnect structure 150 is formed over the first substrate 102. The first interconnect structure 150 includes the first metal layer 152 and the first diffusion barrier layer 153 formed in the first dielectric layer 154. In addition, the first interconnect structure 150 includes multiple conductive layers 158. The first metal layer 152 is electrically connected to the TSV structure 120 by the conductive layers 158.

The first seed layer 162 and the first barrier layer 164 are formed over the first interconnect structure 150, and the first IMC 170 is formed over the first barrier layer 164. In some embodiments, the first IMC 170 is made of $Ni_3Sn_4$, $Cu_6Sn_5$, $(CuNi)_6Sn_5$, $(CuNi)_3Sn_4$ or another applicable material. In some embodiments, the first IMC 170 has a number of protruding portions.

The second die 20 includes a second ILD layer 206 over the second substrate 202 and the device element 204 in the second ILD layer 206. In some embodiments, the second substrate 202 is an integrated circuit (IC) die which is sawed from a wafer, and may be a "known good die". In some embodiments, the IC die is a logic die, a memory die or another applicable type of die.

The device elements 204 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 204, such as deposition, etching, implantation, photolithography, annealing, and/or other applicable processes. In some embodiments, device elements 204 are formed in the second substrate 202 in a front-end-of-line (FEOL) process.

The second interconnect structure 250 is formed over the ILD layer 206. The second interconnect structure 250 includes the second metal layer 252 and the second diffusion barrier layer 253 formed in the dielectric layer 254. The second seed layer 262 is formed over the second interconnect structure 250, and the second barrier layer 264 is formed over the second seed layer 262. The solder layer 266 is formed over the second barrier layer 264.

Figure 3B:
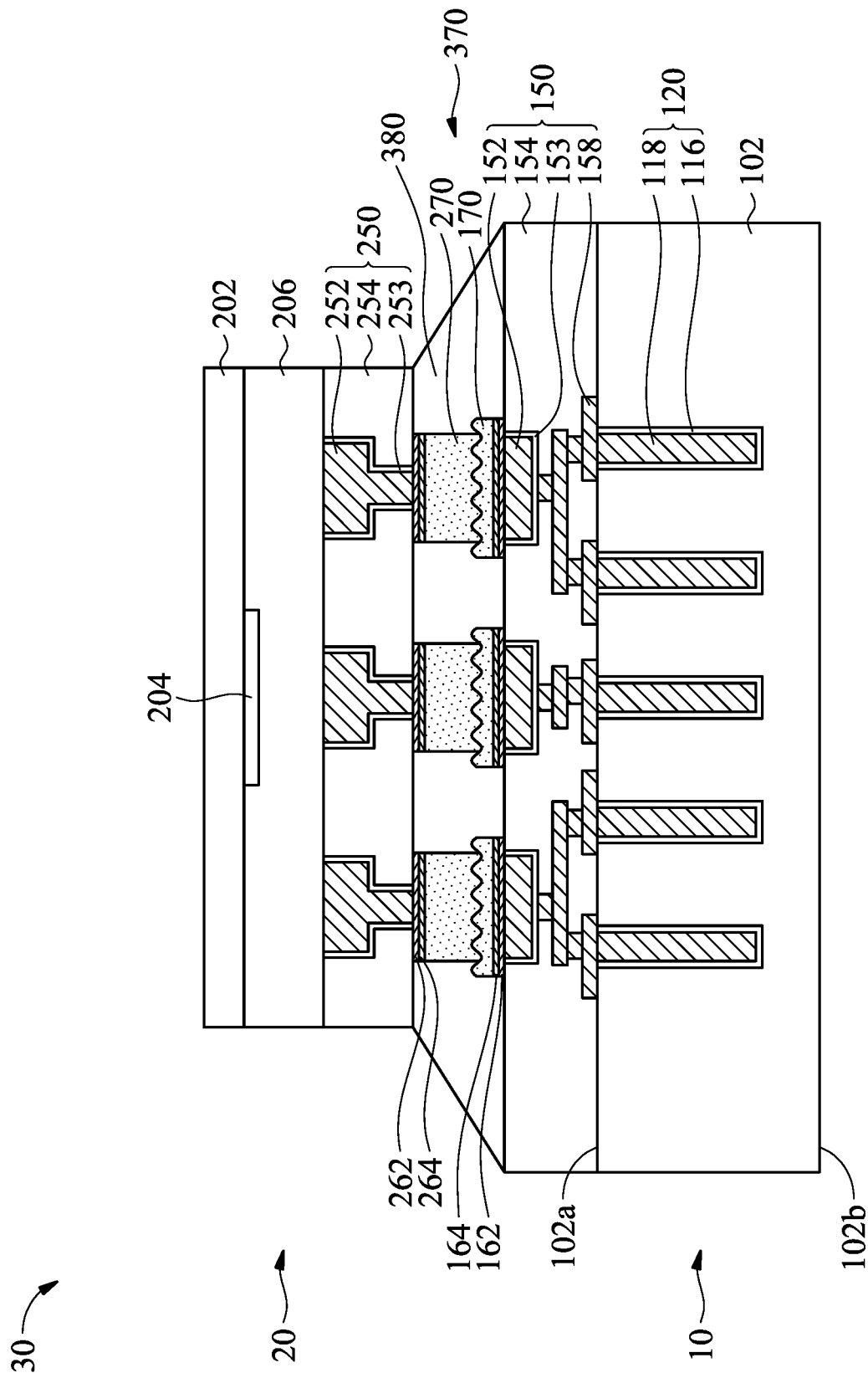

Next, as shown in FIG. 3B, the second die 20 is turned upside down and placed over the first die 10, in accordance with some embodiments of the disclosure. Afterwards, a reflow process is performed on the first IMC 170 and the second solder layer 266 to form the package structure 30.

The second solder layer 266 of the second die 20 is substantially aligned to the first IMC 170 of the first die 10. Subsequently, during the reflow process, the second solder layer 266 and the first IMC 170 are melted and reshaped to form the second IMC 270. The bonding structure 370 is constructed by the first IMC 170 and the second IMC 270. The first IMC 170 is between the second IMC 270 and the first barrier layer 164, and the second IMC 270 is between the first IMC 170 and the second barrier layer 264. An irregular grain boundary is between the first IMC 170 and the second IMC 270.

Afterwards, an underfill layer 380 is formed between the first die 10 and the second die 20. The first IMC 170 and the second IMC 270 are embedded in and protected by the underfill layer 380. In some embodiments, the underfill layer 380 includes liquid epoxy, deformable gel, silicon rubber, another suitable material, or a combination thereof. In some embodiments, the underfill layer 380 includes an epoxy-based resin with fillers dispersed therein. The fillers may include insulating fibers, insulating particles, other suitable elements, or a combination thereof. In some embodiments, a dispensing process is performed to form the underfill layer 380.

Figure 3C:
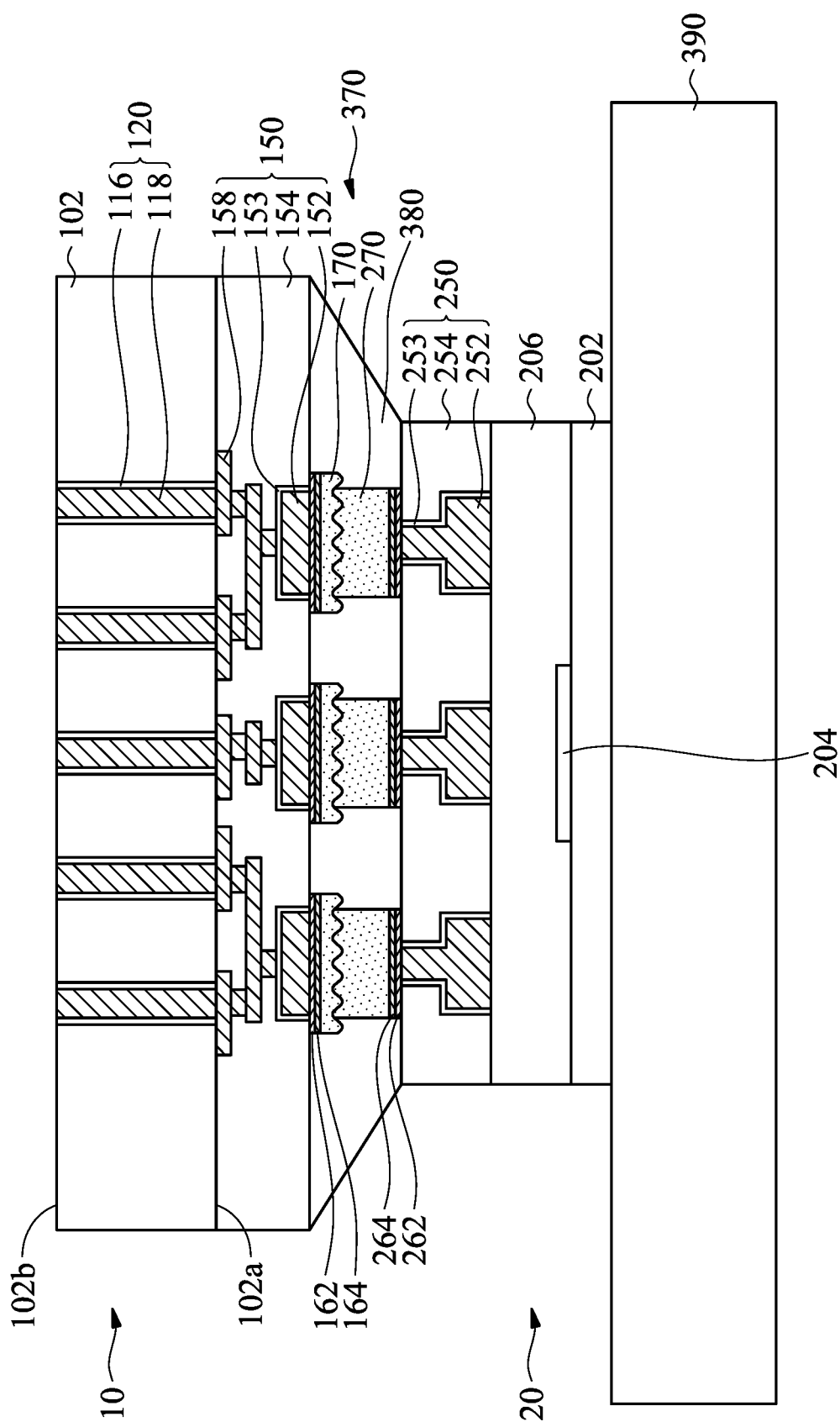

Afterwards, as shown in FIG. 3C, the first die 10 and the second die 20, which are bonded together, are turned upside down and placed over a carrier substrate 390, in accordance with some embodiments of the disclosure.

In some embodiments, the carrier substrate 390 is used as a temporary substrate. The temporary substrate provides mechanical and structural support during subsequent processing steps, such as those described in more detail later. The carrier substrate 390 is made of a semiconductor material, ceramic material, polymer material, metal material, another suitable material, or a combination thereof. In some embodiments, the carrier substrate 390 is a glass substrate. In some other embodiments, the carrier substrate 390 is a semiconductor substrate, such as a silicon wafer.

In some embodiments, the first die 10 is attached to the carrier substrate 390 through an adhesive layer (not shown). The adhesive layer is used as a temporary adhesive layer. The adhesive layer may be glue or a tape. In some embodiments, the adhesive layer is photosensitive and can easily be detached from the carrier substrate 390 by light irradiation. For example, shining ultra-violet (UV) light or laser light on the carrier substrate 390 is used to detach the adhesive layer. In some embodiments, the adhesive layer is a light-to-heat-conversion (LTHC) coating. In some other embodiments, the adhesive layer is heat-sensitive and can easily be detached from the carrier substrate 390 when it is exposed to heat.

Next, the first substrate 102 of the first die 10 is thinned using the carrier substrate 390 as a support. In some embodiments, the first substrate 102 is thinned from the second surface 102b until the TSV structure 120 is exposed. In some embodiments, the first substrate 102 is thinned by a planarization process. The planarization process may include a chemical mechanical polishing (CMP) process, a grinding process, an etching process, another applicable process, or a combination thereof.

Figure 3D:
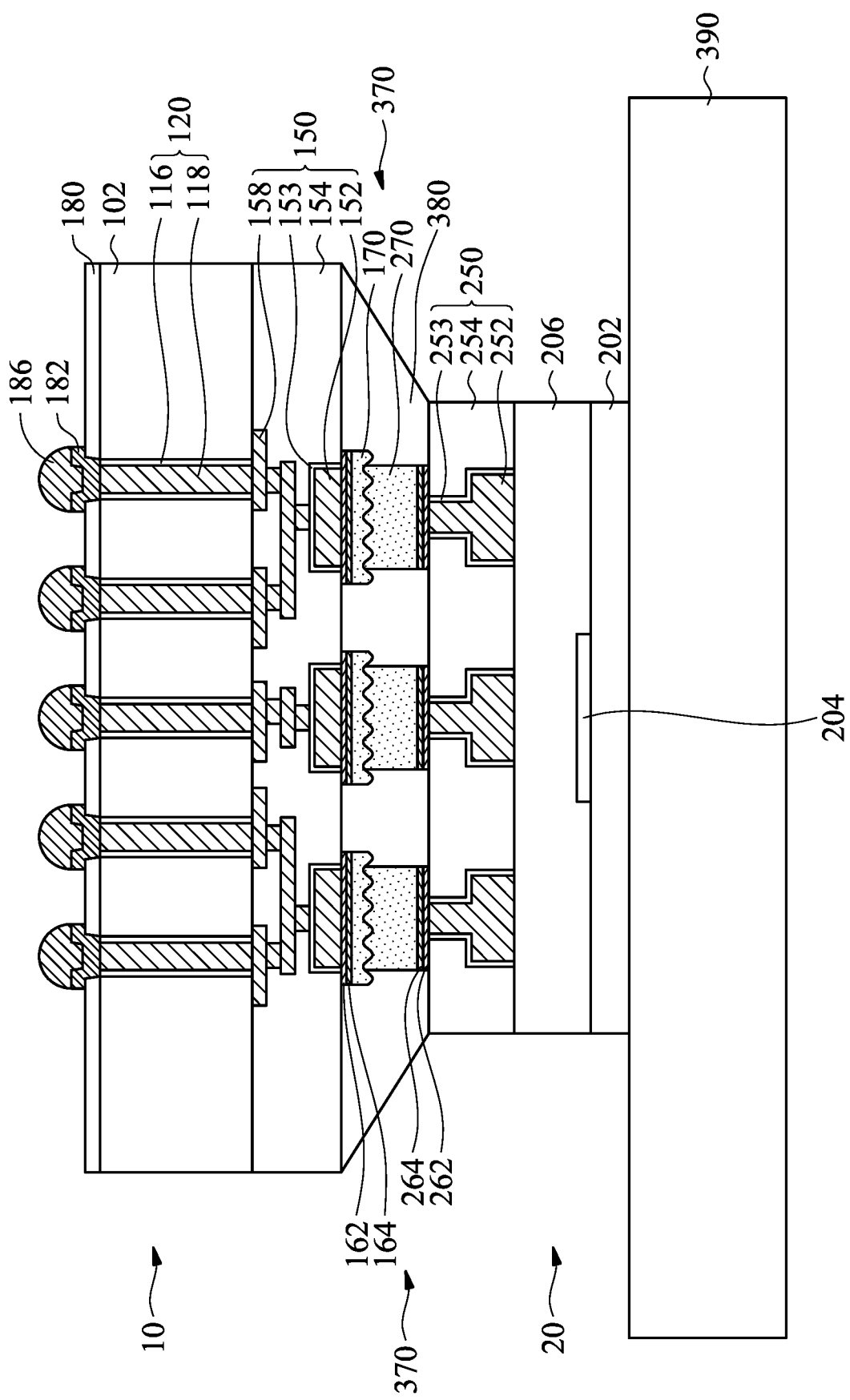

Afterwards, as shown in FIG. 3D, a passivation layer 180 is formed over the first substrate 102, and the passivation layer 180 is patterned to form a number of openings. The openings expose portions of the conductive structure 118 of the TSV structure 120. The passivation layer 180 is made of dielectric material(s) and provides stress relief for bonding stress incurred during subsequent bonding processes. In some embodiments, the passivation layer 180 is made of PBO, BCB, silicone, acrylates, siloxane, another suitable material, or a combination thereof. In some other embodiments, the passivation layer 180 is made of non-organic materials. The non-organic materials includes silicon oxide, un-doped silicate glass, silicon oxynitride, SR, silicon nitride, silicon carbide, HMDS, another suitable material, or a combination thereof.

Next, a number of UBM layer 182 are formed in the openings, and a number of the connectors 186 are formed over the 182. The connectors 186 are formed over the passivation layer 180. The connectors 186 are electrically connected to the TSV structure 120. In some embodiments, the connectors 186 are referred to as controlled collapse chip connection (C4) bumps or micro-bumps.

Figure 3E:
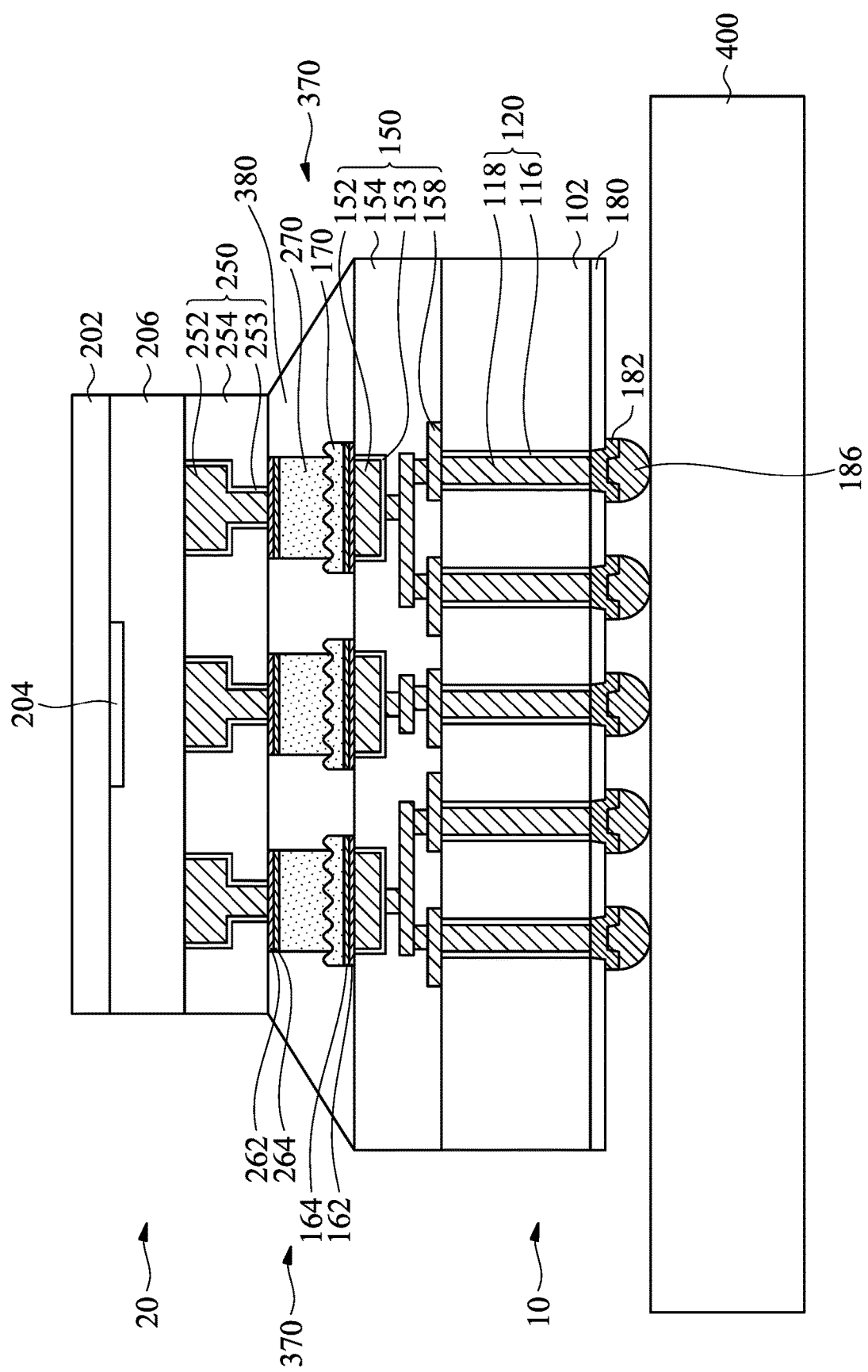

Afterwards, as shown in FIG. 3E, the carrier substrate 390 is removed, and the package structure 30 is bonded to a third substrate 400 through the connectors 186, in accordance with some embodiments of the disclosure. In some embodiments, suitable light is provided to detach the adhesive layer and lift off the carrier substrate 390. In some embodiments, the third substrate 400 is a printed circuit board (PCB), a ceramic substrate or another suitable package substrate. Next, a reflow process is performed on the package structures 30 and the third substrate 400 to form a package structure 40.

The bonding structure 307 as shown in FIG. 3E, as the pitch between two adjacent first IMC 170 is gradually decreased, the bonding quality become more important. This embodiment provides a bonding process without using flux, and therefore the bonding quality of the package structure with the bonding structure is improved.

Figure 4A:
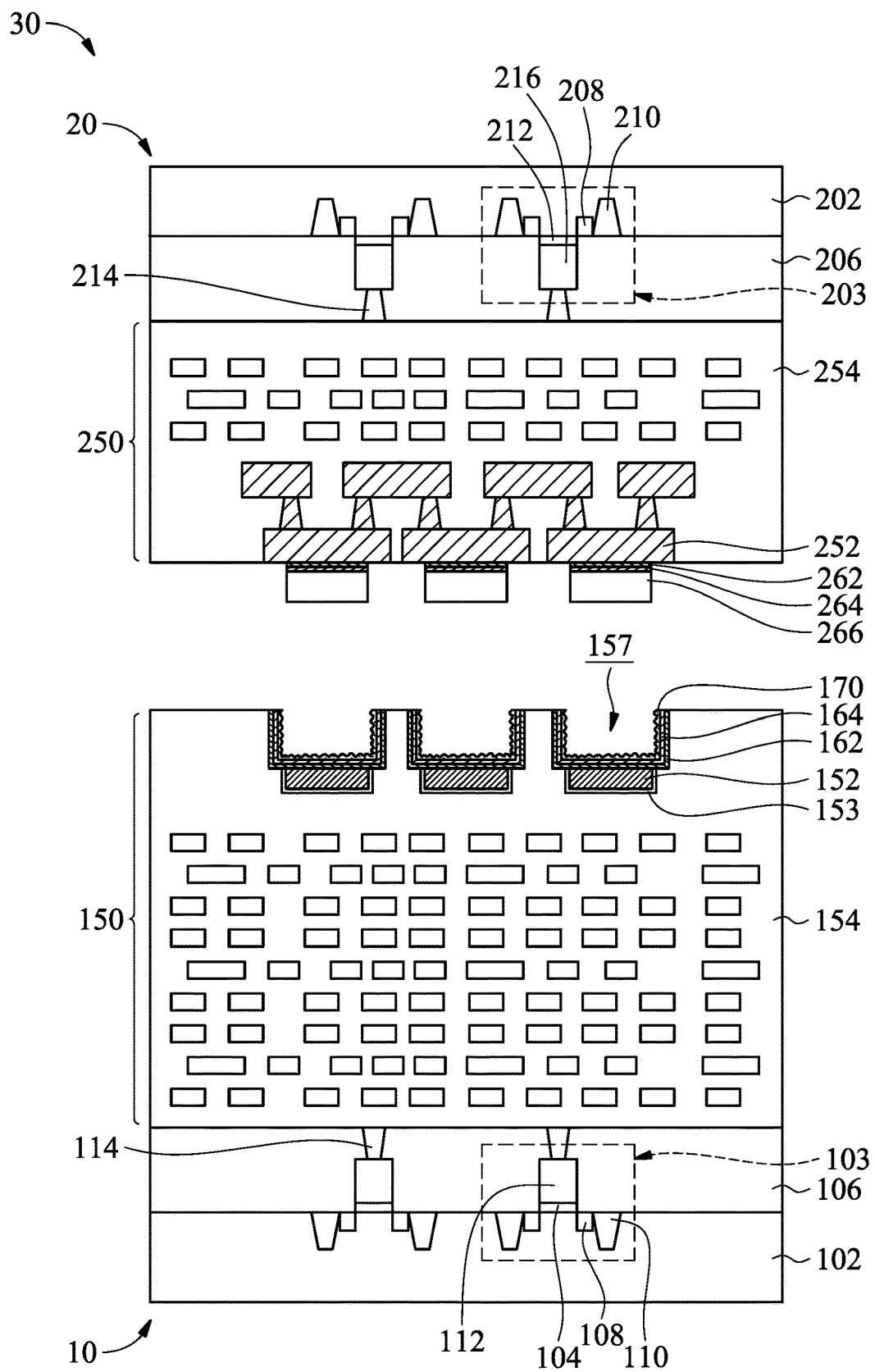
FIGS. 4A-4B show cross-sectional representations of various stages of forming a package structure, in accordance with some embodiments of the disclosure.
Figure 4B:
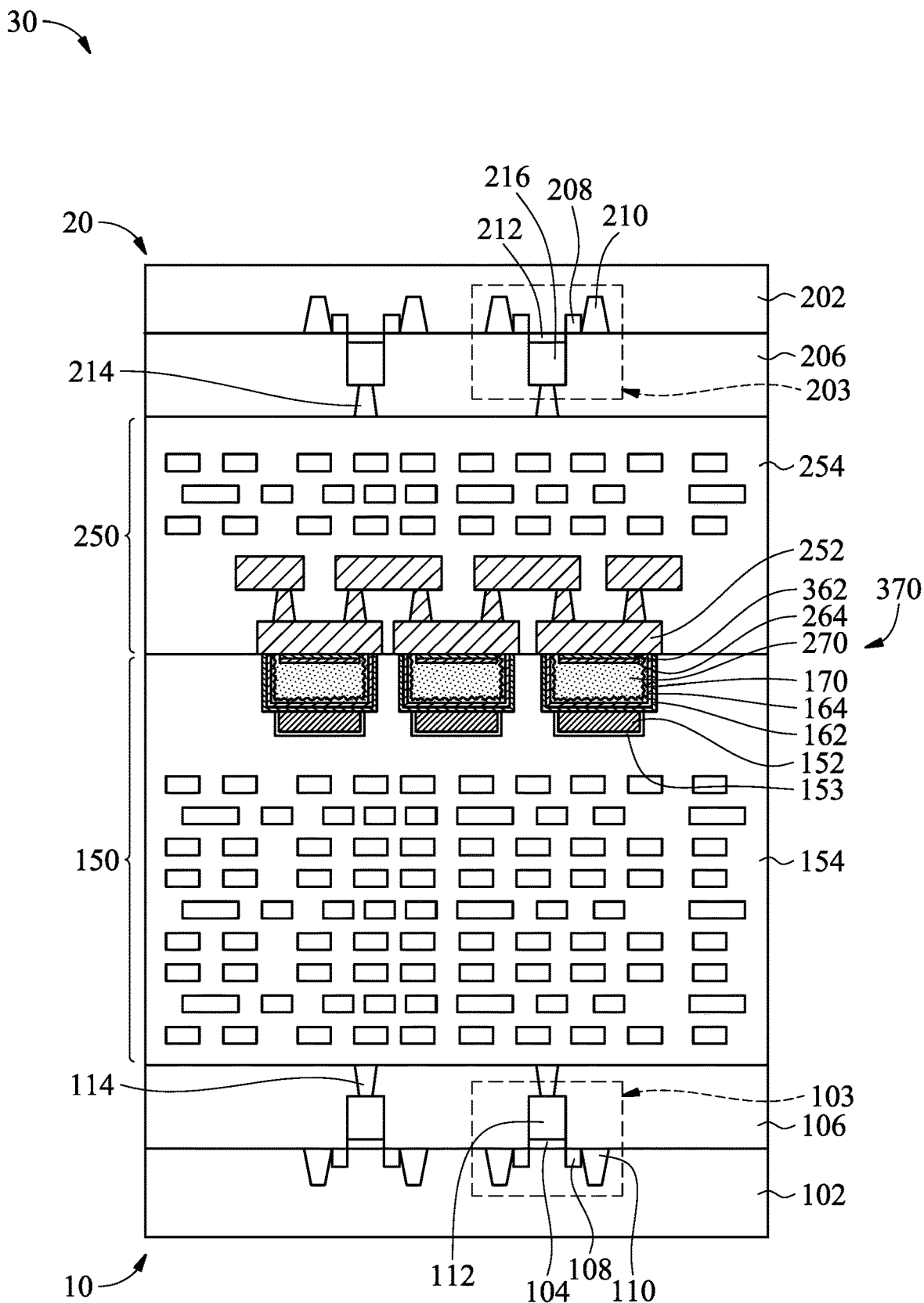

FIGS. 4A-4B show cross-sectional representations of various stages of forming a package structure 30, in accordance with some embodiments of the disclosure.

As shown in FIG. 4A, the first die 10 and the second die 20 are provided. The first die 10 includes a first ILD layer 106 formed over the first substrate 202. A number of device regions 103 are formed in the ILD layer 106. Each device regions 103 includes a first gate dielectric layer 104 and a first gate electrode layer 112 on the first gate dielectric layer 104. The first source/drain (S/D) structures 108 and the first isolation structures 110, such as shallow trench isolation (STI) structures are formed in the first substrate 102.

A first contact via 114 is formed over the first device regions 103 and is electrically connect to the first interconnect structure 150. The first interconnect structure 150 is formed over the ILD layer 106. The recess 157 is formed over the interconnect structure 150. The first seed layer 162 and the first barrier layer 164 are sequentially formed in the recess 157, and the first IMC 170 is formed over the first barrier layer 164.

The second die 20 includes a second ILD layer 206 formed over the second substrate 202. A number of device regions 203 are formed in the second ILD layer 206. Each device regions 203 includes a second gate dielectric layer 212 and a second gate electrode layer 216. The second S/D structures 208 and the second isolation structures 210 are formed in the second substrate 202.

A second contact via 214 is formed over the second device regions 203 and is electrically connect to the second interconnect structure 250. The second interconnect structure 250 is formed over the ILD layer 106. The second seed layer 262 is formed over the second interconnect structure 250, and the second barrier layer 264 is formed over the second seed layer 262. The second solder layer 266 is formed over the second barrier layer 264.

Next, as shown in FIG. 4B, the first die 10 is bonded to the second die 20 by bonding the dielectric layer 154 to the dielectric layer 254, and bonding the first IMC 170 to the second solder layer 266. As a result, the bonding structure 370 is formed and includes the dielectric-to-dielectric bonding portion and the conductive-to conductive bonding portion. The dielectric-to-dielectric bonding portion is constructed by the dielectric layer 154 to the dielectric layer 254, and the conductive-to conductive bonding portion is constructed by the first IMC 170 and the second IMC 270.

Figure 5:
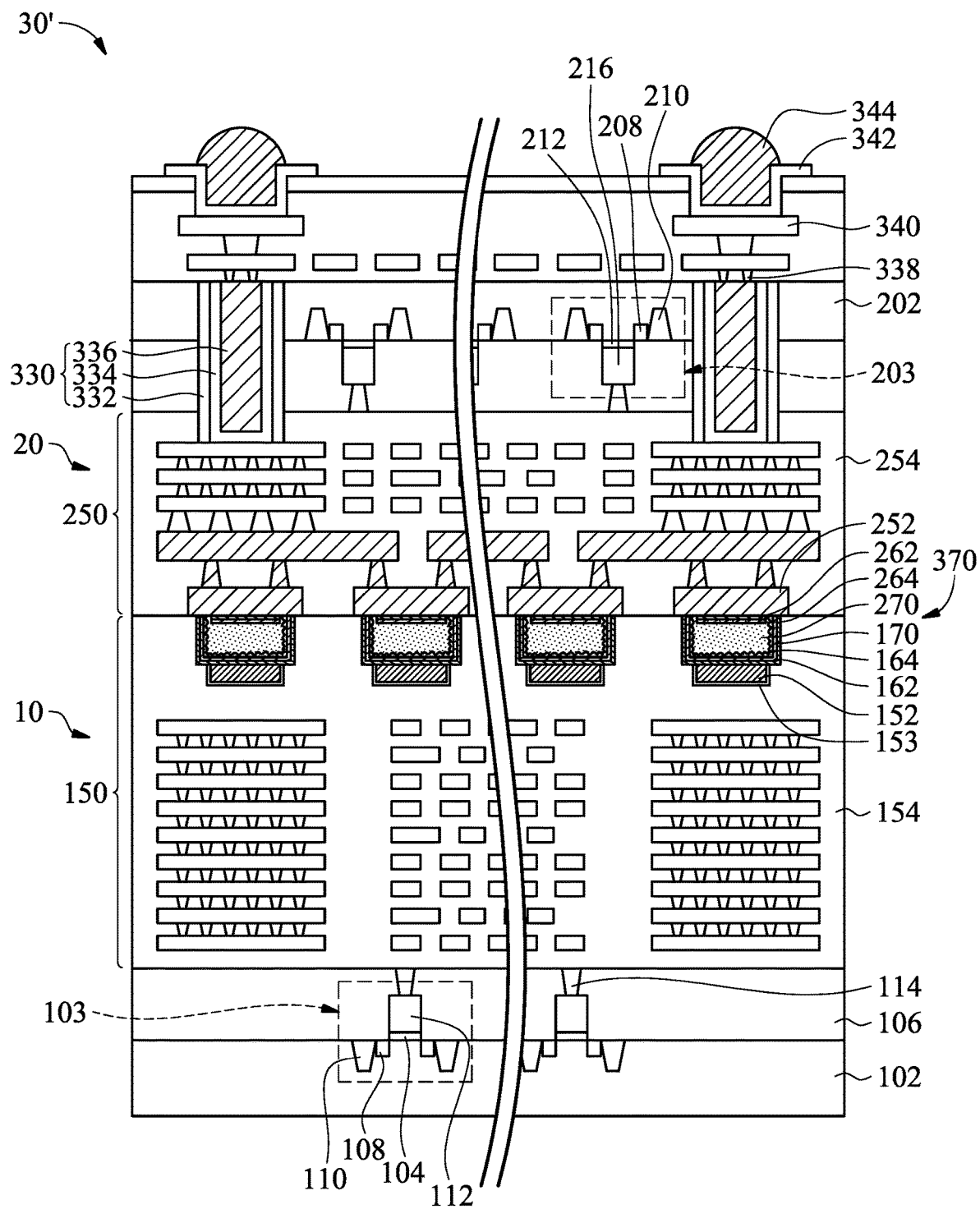
FIG. 5 shows a cross-sectional representation of a package structure, in accordance with some embodiments of the disclosure.

FIG. 5 shows a cross-sectional representation of a package structure 30', in accordance with some embodiments of the disclosure. The package structure 30' is similar to the package structure 30, the difference between FIG. 5 and FIG. 4B is that the through substrate via (TSV) structure 330 is formed in the second substrate 202 in FIG. 5.

As shown in FIG. 5, the TSV structure 330 is formed through the second substrate 202. The TSV structure 330 is electrically connected to the second interconnect structure 250. In some embodiments, the TSV structure 330 includes a liner 332, a diffusion barrier layer 334, and a conductive via material 336.

A via 338 and a pad 340 are formed over the TSV structure 330. An under bump metallization (UBM) layer 342 is formed over the pad 340. A conductive structure 344 is formed over the UBM layer 342.

It should be noted that the first IMC 170 is not easily oxidized and provides a clean bonding surface. Therefore, the bonding structure 30 is provided without using flux. Furthermore, the first IMC 170 has a number of protruding structures in direct contact with the second solder layer 266 with soft surfaces during the reflow process. The oxide formed over the surfaces of the second solder layer 266 may be broken by the protruding structures of the first IMC 170. Therefore, the fresh surfaces of the second solder layer 266 are produced. In addition, the reflow process for bonding the second solder layer 266 and the first IMC 170 is operated at relatively low temperature compared with the copper-to-copper bonding, and the bonding process has a low thermal budget. Therefore, the bonding quality and the bonding yield of the package structures 30 and 40 are improved.

In some embodiments, as shown in FIGS. 1A-1I, 1I' and 3A-3E, the first IMC 170 is firstly formed over the first substrate 102, and then the first IMC 170 is bonded to the second solder layer 266 to form the bonding structure 370. The bonding structure 370 includes the first IMC 170 and the second IMC 270, and the irregular grain boundary is between the first IMC 170 and the second IMC 270.

In some embodiments, as shown in FIGS. 2A-2H, 2H', 4A-4B and 5, the bonding structure 370 is a hybrid bonding structure which includes a dielectric-to-dielectric bonding portion and the conductive-to-conductive bonding portion. The conductive-to-conductive bonding portion includes the second IMC 270 and the first IMC 170, and dielectric-to-dielectric bonding portion includes the second dielectric layer 156 and the dielectric layer 254. The grain boundary is between the first IMC 170 and the second IMC 270.

Embodiments for forming a package structure and method for forming the same are provided. The package structure includes a first die bonded to a second die. A first IMC is first formed over the first die, and a second solder layer is formed over the second die. The first die is bonded to the second die by bonding the first IMC and the second solder layer to form a bonding structure. The bonding structure includes the first IMC and a second IMC, and there is a grain boundary between the first IMC and the second IMC with partial grain impingement. The first IMC is oxide-free, and therefore the package structure is formed without using flux. In addition, the bonding process is operated at a relatively low temperature and therefore the bonding process has a low thermal budget. Therefore, the bonding quality and the bonding yield of the package structure are improved.

In some embodiments, a package structure is provided. The package structure includes a first interconnect structure formed over a first substrate, and the first interconnect structure includes a first metal layer. The package structure further includes a second interconnect structure formed below a second substrate. The package structure includes a bonding structure between the first interconnect structure and the second interconnect structure. The bonding structure includes a first intermetallic compound (IMC) and a second intermetallic compound (IMC), a portion of the first IMC protrudes from the sidewall surfaces of the second IMC, and a grain boundary is present between the first IMC and the second IMC.

In some embodiments, a package structure is provided. The package structure includes a first interconnect structure formed over a first substrate, and the first interconnect structure includes a first dielectric layer. The package structure includes a second interconnect structure formed below a second substrate. The package structure further includes a bonding structure between the first interconnect structure and the second interconnect structure. The bonding structure is embedded in the first dielectric layer, the bonding structure includes a first intermetallic compound (IMC) and a second intermetallic compound (IMC), and a grain boundary is present between the first IMC and the second IMC.

In some embodiments, a method for forming a package structure is provided. The method includes forming a first interconnect structure over a first substrate and forming a first IMC over the first interconnect structure. The method also includes forming a second interconnect structure over a second substrate and forming a solder layer over the second interconnect structure. The method includes bonding the first substrate and the second substrate by bonding the first IMC to the solder layer to form a second intermetallic compound (IMC). The grain boundary is present between the first IMC and the second IMC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
   a first interconnect structure formed over a first substrate, wherein the first interconnect structure comprises a first dielectric layer;
   a second interconnect structure formed below a second substrate;
   a bonding structure between the first interconnect structure and the second interconnect structure, wherein the bonding structure is embedded in the first dielectric layer, the bonding structure comprises a first intermetallic compound (IMC) and a second intermetallic compound (IMC), and a grain boundary is present between the first IMC and the second IMC;
   a first seed layer embedded in the second IMC; and
   a first barrier layer below the first seed layer, wherein the first barrier layer is embedded in the second IMC.

2. The package structure as claimed in claim 1, wherein the second interconnect structure comprises a second dielectric layer, and the bonding structure further comprises a dielectric bonding portion which is made of the first dielectric layer and the second dielectric layer.

3. The package structure as claimed in claim 1, wherein the first IMC has a plurality of protruding structures.

4. The package structure as claimed in claim 1, wherein sidewall surfaces and a bottom surface of the second IMC are in direct contact with the first IMC.

5. The package structure as claimed in claim 1, further comprising:
   an air gap between the first dielectric layer and the bonding structure.

6. The package structure as claimed in claim 1, further comprising:
   a second seed layer formed in the first dielectric layer; and
   a second barrier layer formed over the second seed layer, wherein the second barrier layer is between the second seed layer and the first IMC.

7. The package structure as claimed in claim 1, wherein the first IMC and the second IMC have different grain sizes.

8. The package structure as claimed in claim 1, further comprising:
   a solder material between the first IMC and the second IMC.

9. The package structure as claimed in claim 1, further comprising:
   a through substrate via (TSV) structure formed through the second substrate, wherein the TSV structure is electrically connected to the second interconnect structure.

10. The package structure as claimed in claim 1, wherein a top surface of first barrier layer is lower than a top surface of the first IMC.

11. A package structure, comprising:
   a first device region formed over a first substrate;
   a second device region formed below a second substrate;
   a bonding structure between the first device region and the second device region, wherein the bonding structure comprises a first intermetallic compound (IMC) and a second intermetallic compound (IMC) embedded in the first IMC;

a seed layer formed over the first device region; and a barrier layer formed over the seed layer, wherein the barrier layer is between the seed layer and the first IMC.

12. The package structure as claimed in claim 11, wherein a top surface of the first IMC is uneven.

13. The package structure as claimed in claim 11, further comprising:

an air gap between the first IMC and the second IMC.

14. The package structure as claimed in claim 11, further comprising:

a seed layer formed below the second device region; and a barrier layer formed below the seed layer, wherein the barrier layer is between the seed layer and the second IMC.

15. The package structure as claimed in claim 14, further comprising:

an air gap between the seed layer and the first IMC.

16. A package structure, comprising:

a first die comprising a first dielectric layer and a first metal layer formed in the first dielectric layer;

a second die comprising a second dielectric layer and a second metal layer formed in the second dielectric layer;

a bonding structure between the first die and the second die, wherein the bonding structure comprises a third dielectric layer and a first intermetallic compound (IMC) and a second intermetallic compound (IMC) embedded in the third dielectric layer; and a seed layer between the first IMC and the third dielectric layer, wherein the first IMC is surrounded by the seed layer.

17. The package structure as claimed in claim 16, wherein the first IMC has a plurality of needle-shaped structures.

18. The package structure as claimed in claim 16, wherein the second IMC is surrounded by the first IMC.

19. The package structure as claimed in claim 16, wherein an upper portion of the second IMC is separated from the first IMC, and a lower portion of the second IMC is in direct contact with the first IMC.

20. The package structure as claimed in claim 16, further comprising:

a barrier layer between the first IMC and the seed layer, wherein the first IMC is surrounded by the barrier layer.

* * * * *